(12) United States Patent
Fujimura

(10) Patent No.: US 9,323,140 B2
(45) Date of Patent: *Apr. 26, 2016

(54) METHOD AND SYSTEM FOR FORMING A PATTERN ON A RETICLE USING CHARGED PARTICLE BEAM LITHOGRAPHY

(71) Applicant: D2S, Inc., San Jose, CA (US)

(72) Inventor: Akira Fujimura, Saratoga, CA (US)

(73) Assignee: D2S, Inc., San Jose, CA (US)

( * ) Notice: Subject to any disclaimer, the term of this patent is extended or adjusted under 35 U.S.C. 154(b) by 159 days.

This patent is subject to a terminal disclaimer.

(21) Appl. No.: 14/177,679

(22) Filed: Feb. 11, 2014

(65) Prior Publication Data

US 2014/0162466 A1 Jun. 12, 2014

Related U.S. Application Data

(63) Continuation-in-part of application No. 13/236,610, filed on Sep. 19, 2011, now abandoned, and a continuation-in-part of application No. 13/970,465, filed on Aug. 19, 2013, now Pat. No. 8,828,628, which is a continuation of application No. 13/650,618, filed on Oct. 12, 2012, now Pat. No. 8,512,919, which is a continuation of application No. 13/316,564, filed on Dec. 12, 2011, now Pat. No. 8,304,148, which is a continuation of application No. 13/087,334, filed on Apr. 14, 2011, now Pat. No. 8,202,672, which is a continuation of application No. 12/987,994, filed on Jan. 10, 2011, now Pat. No. 8,017,289, which is a continuation of application No. 12/473,265, filed on May 27, 2009, now Pat. No. 7,901,850, which is a continuation-in-part of application No. 12/202,366, filed on Sep. 1, 2008, now Pat. No. 7,759,027.

(60) Provisional application No. 61/172,659, filed on Apr. 24, 2009.

(51) Int. Cl.
| | |
|---|---|
| G03F 1/20 | (2012.01) |
| G03F 1/70 | (2012.01) |
| G06F 17/50 | (2006.01) |
| H01L 21/263 | (2006.01) |
| H01J 37/302 | (2006.01) |
| H01J 37/317 | (2006.01) |

(52) U.S. Cl.
CPC .............. *G03F 1/20* (2013.01); *G06F 17/5072* (2013.01); *G06F 17/5081* (2013.01); *H01J 37/3026* (2013.01); *H01J 37/3174* (2013.01); *H01L 21/263* (2013.01); *G03F 1/70* (2013.01); *H01J 2237/31764* (2013.01); *H01J 2237/31774* (2013.01); *H01J 2237/31776* (2013.01)

(58) Field of Classification Search
CPC ......... G03F 1/20; G03F 1/70; G06F 17/5072; G06F 17/5081; H01J 37/3174; H01J 37/3026; H01J 2237/31764; H01J 2237/31774; H01J 2237/31776; H01L 21/263

USPC ........................ 430/5, 30, 296, 942; 716/53
See application file for complete search history.

(56) References Cited

U.S. PATENT DOCUMENTS

| | | |
|---|---|---|
| 4,634,871 A | 1/1987 | Knauer |
| 4,698,509 A | 10/1987 | Wells et al. |
| 4,712,013 A | 12/1987 | Nishimura |
| 4,818,885 A | 4/1989 | Davis et al. |
| 5,082,762 A | 1/1992 | Takahashi |
| 5,103,101 A | 4/1992 | Berglund et al. |
| 5,173,582 A | 12/1992 | Sakamoto et al. |
| 5,334,282 A | 8/1994 | Nakayama et al. |
| 5,723,237 A | 3/1998 | Kobayashi et al. |
| 5,804,339 A | 9/1998 | Kim |
| 5,825,039 A | 10/1998 | Hartley |
| 5,856,677 A | 1/1999 | Okino |
| 5,885,747 A | 3/1999 | Yamasaki et al. |
| 5,885,748 A | 3/1999 | Ohnuma |
| 6,037,601 A | 3/2000 | Okunuki |
| 6,049,085 A | 4/2000 | Ema |
| 6,087,046 A | 7/2000 | Nakasuji |
| 6,218,671 B1 | 4/2001 | Gordon et al. |
| 6,262,427 B1 | 7/2001 | Gordon |

(Continued)

FOREIGN PATENT DOCUMENTS

| | | |
|---|---|---|
| CN | 1193810 A | 9/1998 |
| EP | 1429368 A2 | 6/2004 |

(Continued)

OTHER PUBLICATIONS

Notice of Allowance and Fees dated Oct. 10, 2014 for U.S. Appl. No. 13/801,554.
Office Action dated Dec. 16, 2014 for U.S. Appl. No. 13/948,725.
Office Action dated Nov. 11, 2014 for Japanese Patent Application No. 2012-526931.
Office Action dated Oct. 15, 2014 for U.S. Appl. No. 13/862,476.
Office Action dated Oct. 20, 2014 for U.S. Appl. No. 13/862,471.
Office Action dated Oct. 24, 2014 for U.S. Appl. No. 14/106,584.
Official Letter and Search Report dated Oct. 24, 2014 for Taiwanese Patent Application No. 099134187.

(Continued)

*Primary Examiner* — Christopher Young
(74) *Attorney, Agent, or Firm* — The Mueller Law Office, P.C.

(57) ABSTRACT

A method and system for fracturing or mask data preparation is disclosed in which a plurality of charged particle beam shots is determined which will produce a pattern on a reticle, where the reticle is to be used to form an aerial image on a resist-coated substrate using an optical lithographic process. A simulated reticle pattern is then calculated from the plurality of charged particle beam shots. A calculated aerial substrate image is then calculated using the simulated reticle pattern, and a shot in the plurality of shots is modified to improve the calculated aerial substrate image. Similar methods for forming a pattern on a reticle and for manufacturing an integrated circuit are also disclosed.

26 Claims, 11 Drawing Sheets

(56) References Cited

U.S. PATENT DOCUMENTS

| | | |
|---|---|---|
| 6,291,119 B2 | 9/2001 | Choi et al. |
| 6,372,391 B1 | 4/2002 | Wolfe et al. |
| 6,416,912 B1 | 7/2002 | Kobayashi et al. |
| 6,433,348 B1 | 8/2002 | Abboud et al. |
| 6,544,700 B2 | 4/2003 | Ogino |
| 6,557,162 B1 | 4/2003 | Pierrat |
| 6,610,989 B1 | 8/2003 | Takahashi |
| 6,627,366 B2 | 9/2003 | Yang |
| 6,677,089 B2 | 1/2004 | Ogino et al. |
| 6,803,589 B2 | 10/2004 | Nakasugi |
| 6,891,175 B2 | 5/2005 | Hiura |
| 6,917,048 B2 | 7/2005 | Fujiwara et al. |
| 6,982,135 B2 | 1/2006 | Chang et al. |
| 7,150,949 B2 | 12/2006 | Askebjer et al. |
| 7,269,819 B2 | 9/2007 | Hoshino |
| 7,420,164 B2 | 9/2008 | Nakasuji et al. |
| 7,449,700 B2 | 11/2008 | Inanami |
| 7,536,664 B2 | 5/2009 | Cohn et al. |
| 7,592,611 B2 | 9/2009 | Kasahara et al. |
| 7,703,069 B1 | 4/2010 | Liu et al. |
| 7,716,627 B1 | 5/2010 | Ungar et al. |
| 7,754,401 B2 | 7/2010 | Fujimura et al. |
| 7,759,027 B2 | 7/2010 | Fujimura et al. |
| 7,799,489 B2 | 9/2010 | Fujimura et al. |
| 7,824,828 B2 | 11/2010 | Fujimura et al. |
| 7,901,850 B2 | 3/2011 | Fujimura et al. |
| 7,981,575 B2 | 7/2011 | Fujimura et al. |
| 8,017,289 B2 | 9/2011 | Fujimura et al. |
| 8,039,176 B2 | 10/2011 | Fujimura et al. |
| 8,062,813 B2 | 11/2011 | Zable et al. |
| 8,137,871 B2 | 3/2012 | Zable et al. |
| 8,202,672 B2 | 6/2012 | Fujimura et al. |
| 8,202,673 B2 | 6/2012 | Fujimura et al. |
| 8,304,148 B2 | 11/2012 | Fujimura et al. |
| 8,354,207 B2 | 1/2013 | Fujimura et al. |
| 8,473,875 B2 | 6/2013 | Fujimura et al. |
| 8,501,374 B2 | 8/2013 | Fujimura et al. |
| 8,828,628 B2 | 9/2014 | Fujimura |
| 8,900,778 B2 | 12/2014 | Fujimura et al. |
| 2002/0005494 A1 | 1/2002 | Kamijo et al. |
| 2002/0020824 A1 | 2/2002 | Itoh |
| 2002/0036273 A1 | 3/2002 | Okino |
| 2002/0125444 A1 | 9/2002 | Kojima |
| 2002/0129328 A1 | 9/2002 | Komatsuda |
| 2003/0043358 A1 | 3/2003 | Suganuma et al. |
| 2003/0044703 A1 | 3/2003 | Yamada |
| 2003/0077530 A1 | 4/2003 | Fujiwara et al. |
| 2003/0082461 A1 | 5/2003 | Carpi |
| 2003/0087191 A1 | 5/2003 | Lavallee et al. |
| 2003/0159125 A1 | 8/2003 | Wang et al. |
| 2003/0203287 A1 | 10/2003 | Miyagawa |
| 2004/0011966 A1 | 1/2004 | Sasaki et al. |
| 2004/0099636 A1 | 5/2004 | Scipioni |
| 2004/0131977 A1 | 7/2004 | Martyniuk et al. |
| 2004/0229133 A1 | 11/2004 | Socha et al. |
| 2005/0053850 A1 | 3/2005 | Askebjer et al. |
| 2005/0075819 A1 | 4/2005 | Paxton et al. |
| 2005/0211921 A1 | 9/2005 | Wieland et al. |
| 2005/0221204 A1 | 10/2005 | Kimura |
| 2005/0263715 A1 | 12/2005 | Nakasuji et al. |
| 2005/0287451 A1 | 12/2005 | Hudek et al. |
| 2006/0085773 A1 | 4/2006 | Zhang |
| 2006/0218520 A1 | 9/2006 | Pierrat et al. |
| 2007/0114453 A1 | 5/2007 | Emi et al. |
| 2007/0114463 A1 | 5/2007 | Nakasugi et al. |
| 2007/0162889 A1 | 7/2007 | Broeke et al. |
| 2007/0187624 A1 | 8/2007 | Suzuki et al. |
| 2007/0196768 A1 | 8/2007 | Ogino |
| 2007/0280526 A1 | 12/2007 | Malik et al. |
| 2008/0050676 A1 | 2/2008 | Hoshino |
| 2008/0054196 A1 | 3/2008 | Hiroshima |
| 2008/0116397 A1 | 5/2008 | Yoshida et al. |
| 2008/0116398 A1 | 5/2008 | Hara et al. |
| 2008/0116399 A1 | 5/2008 | Fujimura |
| 2008/0118852 A1 | 5/2008 | Mitsuhashi |
| 2008/0128637 A1 | 6/2008 | Yoshida |
| 2008/0203324 A1 | 8/2008 | Fujimura et al. |
| 2008/0213677 A1 | 9/2008 | Saito |
| 2009/0200495 A1 | 8/2009 | Platzgummer |
| 2009/0325085 A1 | 12/2009 | Yoshida et al. |
| 2010/0055580 A1 | 3/2010 | Fujimura et al. |
| 2010/0055585 A1 | 3/2010 | Fujimura et al. |
| 2010/0058279 A1 | 3/2010 | Fujimura et al. |
| 2010/0058282 A1 | 3/2010 | Fujimura et al. |
| 2010/0148087 A1 | 6/2010 | Doering et al. |
| 2010/0183963 A1 | 7/2010 | Zable et al. |
| 2010/0209834 A1 | 8/2010 | Yao et al. |
| 2010/0251202 A1 | 9/2010 | Pierrat |
| 2010/0264335 A1 | 10/2010 | Hoyle et al. |
| 2010/0315611 A1 | 12/2010 | Kato |
| 2010/0325595 A1 | 12/2010 | Song et al. |
| 2011/0033788 A1 | 2/2011 | Kato |
| 2011/0045409 A1 | 2/2011 | Fujimura |
| 2011/0053056 A1 | 3/2011 | Fujimura et al. |
| 2011/0053093 A1 | 3/2011 | Hagiwara et al. |
| 2011/0116067 A1 | 5/2011 | Ye et al. |
| 2011/0145769 A1 | 6/2011 | Wei |
| 2011/0159435 A1 | 6/2011 | Zable et al. |
| 2011/0177458 A1 | 7/2011 | Kotani et al. |
| 2011/0191727 A1 | 8/2011 | Fujimura et al. |
| 2012/0084740 A1 | 4/2012 | Fujimura et al. |
| 2012/0096412 A1 | 4/2012 | Fujimura et al. |
| 2012/0149133 A1 | 6/2012 | Parrish et al. |
| 2012/0151428 A1 | 6/2012 | Tanaka et al. |
| 2012/0217421 A1 | 8/2012 | Fujimura et al. |
| 2012/0329289 A1 | 12/2012 | Fujimura et al. |
| 2013/0070222 A1 | 3/2013 | Fujimura |
| 2013/0283218 A1 | 10/2013 | Fujimura et al. |

FOREIGN PATENT DOCUMENTS

| | | |
|---|---|---|
| EP | 2302659 A2 | 3/2011 |
| GB | 2367908 | 4/2002 |
| JP | S5425675 A | 2/1979 |
| JP | S54025675 | 2/1979 |
| JP | S608844 A | 1/1985 |
| JP | 61105839 | 5/1986 |
| JP | 63007631 | 1/1988 |
| JP | H02280315 A | 11/1990 |
| JP | 03205815 | 9/1991 |
| JP | H03205815 A | 9/1991 |
| JP | 04058518 | 2/1992 |
| JP | 04096065 | 3/1992 |
| JP | 1992155337 | 5/1992 |
| JP | 04196516 | 7/1992 |
| JP | H04196516 A | 7/1992 |
| JP | H04307723 A | 10/1992 |
| JP | 05036595 | 2/1993 |
| JP | H0536595 A | 2/1993 |
| JP | H05036595 | 2/1993 |
| JP | 05114549 | 5/1993 |
| JP | 05198483 | 8/1993 |
| JP | 05267132 | 10/1993 |
| JP | 05267133 | 10/1993 |
| JP | H05267133 A | 10/1993 |
| JP | H05335221 A | 12/1993 |
| JP | H0620931 A | 1/1994 |
| JP | H06020931 | 1/1994 |
| JP | 06124883 | 5/1994 |
| JP | 06252036 | 9/1994 |
| JP | 08055771 | 2/1996 |
| JP | H0855771 A | 2/1996 |
| JP | 08064522 | 3/1996 |
| JP | H08195339 A | 7/1996 |
| JP | 8222504 | 8/1996 |
| JP | H08222504 A | 8/1996 |
| JP | H09266153 A | 10/1997 |
| JP | 10294255 | 11/1998 |
| JP | H11111594 A | 4/1999 |
| JP | 11233401 | 8/1999 |
| JP | 2000012426 A | 1/2000 |
| JP | 2000066366 A | 3/2000 |
| JP | 2000091191 A | 3/2000 |
| JP | 2000123768 A | 4/2000 |

(56) References Cited

FOREIGN PATENT DOCUMENTS

| | | |
|---|---|---|
| JP | 2000138165 A | 5/2000 |
| JP | 2000269123 A | 9/2000 |
| JP | 2001013671 A | 1/2001 |
| JP | 2001093809 A | 4/2001 |
| JP | 2001203157 A | 7/2001 |
| JP | 2001230203 A | 8/2001 |
| JP | 2001305720 A | 11/2001 |
| JP | 2001313253 A | 11/2001 |
| JP | 2002008966 | 1/2002 |
| JP | 2002075830 A | 3/2002 |
| JP | 2002110508 A | 4/2002 |
| JP | 2002202590 A | 7/2002 |
| JP | 2002217092 A | 8/2002 |
| JP | 2002351055 A | 12/2002 |
| JP | 2003195511 A | 7/2003 |
| JP | 2003315976 A | 11/2003 |
| JP | 2003338460 A | 11/2003 |
| JP | 2003347192 A | 12/2003 |
| JP | 2004088071 A | 3/2004 |
| JP | 2004134447 A | 4/2004 |
| JP | 2004134574 A | 4/2004 |
| JP | 2004170410 A | 6/2004 |
| JP | 2004273526 A | 9/2004 |
| JP | 2004304031 A | 10/2004 |
| JP | 2004356440 A | 12/2004 |
| JP | 2005079111 A | 3/2005 |
| JP | 2006032814 A | 2/2006 |
| JP | 2006059348 A | 3/2006 |
| JP | 2006100336 A | 4/2006 |
| JP | 2006100409 A | 4/2006 |
| JP | 2006108447 A | 4/2006 |
| JP | 2006222230 A | 8/2006 |
| JP | 2006294794 A | 10/2006 |
| JP | 2007041090 A | 2/2007 |
| JP | 2007103923 A | 4/2007 |
| JP | 2007242710 A | 9/2007 |
| JP | 2007249167 A | 9/2007 |
| JP | 2007305880 A | 11/2007 |
| JP | 2008053565 A | 3/2008 |
| JP | 2008066441 A | 3/2008 |
| JP | 2008096486 A | 4/2008 |
| JP | 2009147254 A | 7/2009 |
| JP | 2010062562 A | 3/2010 |
| JP | 2011040716 A | 2/2011 |
| KR | 1020080001438 A | 1/2008 |
| TW | 495834 B | 7/2002 |
| TW | I222100 B | 10/2004 |
| TW | I233149 B | 5/2005 |
| TW | 200523524 A | 7/2005 |
| TW | 200604763 A | 2/2006 |
| TW | 200606602 | 2/2006 |
| TW | 200700932 | 1/2007 |
| TW | 200832080 A | 8/2008 |
| TW | 200834366 A | 8/2008 |
| TW | 200900880 A | 1/2009 |
| WO | 03036386 A | 5/2003 |
| WO | 2004077156 A | 9/2004 |
| WO | 2007030528 A2 | 3/2007 |
| WO | 2008064155 A | 5/2008 |
| WO | 2010025031 A2 | 3/2010 |
| WO | 2010025032 A | 3/2010 |
| WO | 2010025060 A2 | 3/2010 |
| WO | 2011025795 A1 | 3/2011 |

OTHER PUBLICATIONS

Official Letter and Search Report dated Sep. 25, 2014 for Taiwanese Patent Application No. 099134186.
Official Letter and Search Report dated Sep. 25, 2014 for Taiwanese Patent Application No. 98128360.
Bloecker, M. et al., "Metrics to Assess Fracture Quality for Variable Shaped Beam Lithography", Proceedings of SPIE, vol. 6349 (Oct. 2006), pp. 63490Z-1-63490Z-10, SPIE P.O. Box 10, Bellingham, WA. 98227, U.S.A.
Chinese Office Action dated Jan. 14, 2013 for Chinese Application No. 200980134188.6.
Chinese Office Action dated Sep. 11, 2013 for Chinese Application No. 200980134188.6.
International Preliminary Report on Patentability and Written Opinion dated Mar. 10, 2011 for PCT Application No. PCT/US2009/053327.
International Preliminary Report on Patentability and Written Opinion dated Mar. 10, 2011 for PCT Patent Application No. PCT/US2009/053328.
International Preliminary Report on Patentability and Written Opinion dated Mar. 10, 2011 for PCT Patent Application No. PCT/US2009/054239.
International Preliminary Report on Patentability and Written Opinion filed on Mar. 10, 2011 for PCT Patent Application No. PCT/US2009/054229.
International Search Report and the Written Opinion dated Apr. 22, 2010 for PCT Application No. PCT/US2009/053328.
International Search Report and the Written Opinion dated Mar. 2, 2010 for PCT Application No. PCT/US2009/053327.
International Search Report and Written Opinion dated Apr. 27, 2012 for PCT Application No. PCT/US2011/055535.
International Search Report and Written Opinion dated Apr. 30, 2012 for PCT Application No. PCT/US2011/055536.
International Search Report and Written Opinion dated Dec. 20, 2012 for PCT Application No. PCT/US2012/054526.
International Search Report and Written Opinion dated Jul. 24, 2013 for PCT Application No. PCT/US2013/036671.
International Search Report and Written Opinion dated Jul. 29, 2013 for PCT Application No. PCT/US2013/036669.
International Search Report and Written Opinion dated Sep. 13, 2012 for PCT Patent Application No. PCT/US2012/043042.
Japanese Office Action dated Aug. 20, 2013 for Japanese Patent Application No. 2011-525073.
Japanese Office Action dated Oct. 1, 2013 for Japanese Patent Application No. 2011-525090.
Japanese Office Action dated Oct. 8, 2013 for Japanese Patent Application No. 2011-525091.
Notice of Allowance and Fee(s) dated Oct. 11, 2013 for U.S. Appl. No. 13/923,368.
Notice of Allowance and Fee(s) due filed on Jan. 20, 2011 for U.S. Appl. No. 12/473,265.
Notice of Allowance and Fees dated Aug. 21, 2013 for U.S. Appl. No. 13/924,019.
Notice of Allowance and Fees dated Aug. 23, 2013 for U.S. Appl. No. 13/723,181.
Notice of Allowance and Fees dated Dec. 26, 2013 for U.S. Appl. No. 13/862,472.
Notice of Allowance and Fees dated Nov. 25, 2013 for U.S. Appl. No. 13/168,953.
Notice of Allowance and Fees dated Sep. 30, 2013 for U.S. Appl. No. 13/269,618.
Notice of Allowance and Fees due dated Mar. 6, 2013 for U.S. Appl. No. 13/168,954.
Notice of Allowance and Fees Dues dated Apr. 5, 2011 for U.S. Appl. No. 12/473,248.
Notice of Allowance dated Aug. 23, 2013 for U.S. Appl. No. 13/723,181.
Notice of Allowance dated Jul. 12, 2011 for U.S. Appl. No. 12/750,709.
Notice of Allowance dated Jun. 21, 2011 for U.S. Appl. No. 12/540,328.
Notice of Allowance dated Jun. 29, 2011 for U.S. Appl. No. 12/540,322.
Notice of Allowance dated Jun. 30, 2011 for U.S. Appl. No. 12/540,321.
Office Action dated Aug. 20, 2010 for U.S. Appl. No. 12/202,365.
Office Action dated Apr. 13, 2012 for U.S. Appl. No. 13/300,601.
Office Action dated Dec. 24, 2012 for U.S. Appl. No. 13/168,954.
Office Action dated Jul. 10, 2012 for U.S. Appl. No. 13/168,954.
Office Action dated Jul. 23, 2013 for Japanese Patent Application No. 2009-200191.

(56) References Cited

OTHER PUBLICATIONS

Office Action dated Jul. 23, 2013 for Japanese Patent Application No. 2011-525072.
Office Action dated Mar. 22, 2013 for U.S. Appl. No. 13/710,426.
Office Action dated Mar. 31, 2011 for U.S. Appl. No. 12/540,328.
Office Action dated Mar. 31, 2011 for U.S. Appl. No. 12/750,709.
Office Action dated May 9, 2013 for U.S. Appl. No. 13/269,618.
Office action dated Nov. 24, 2009 for U.S. Appl. No. 12/269,777, mailed Nov. 24, 2009.
Office Action dated Oct. 1, 2013 for U.S. Appl. No. 13/862,475.
Office Action dated Oct. 25, 2013 for U.S. Appl. No. 13/037,263.
Office Action dated Oct. 29, 2013 for U.S. Appl. No. 13/037,270.
Office Action dated Sep. 1, 2011 for U.S. Appl. No. 13/087,336.
Office Action dated Sep. 1, 2011 for U.S. Appl. No. 13/087,337.
Office Action dated Sep. 10, 2013 for U.S. Appl. No. 13/329,314.
Office Action dated Sep. 24, 2013 for U.S. Appl. No. 13/329,315.
Notice of Allowance and Fees dated Feb. 9, 2015 for U.S. Appl. No. 13/037,270.
Notice of Allowance and Fees dated Jan. 21, 2015 for U.S. Appl. No. 14/257,874.
Notice of Allowance and Fees dated Jan. 23, 2015 for U.S. Appl. No. 13/862,476.
Notice of Allowance and Fees dated Jan. 26, 2015 for U.S. Appl. No. 14/106,584.
Notice of Allowance and Fees dated Mar. 27, 2015 for U.S. Appl. No. 13/948,725.
Office Action dated Feb. 6, 2015 for U.S. Appl. No. 13/862,475.
Office Action dated Jan. 20, 2015 for Japanese Patent Application No. 2012-535223.
Office Action dated Jan. 6, 2015 for Japanese Patent Application No. 2010-183857.
Office Action dated Mar. 27, 2015 for U.S. Appl. No. 14/454,140.
Office Action dated Mar. 3, 2015 for Japanese Patent Application No. 2011-525090.
Notice of Allowance and Fees dated Mar. 20, 2014 for U.S. Appl. No. 13/970,465.
Office Action dated Apr. 3, 2014 for Chinese patent application No. 200980134188.6.
Office Action dated Feb. 14, 2014 for U.S. Appl. No. 13/631,941.
Office Action dated Feb. 27, 2014 for U.S. Appl. No. 13/236,610.
Office Action dated Mar. 11, 2014 for U.S. Appl. No. 13/959,530.
Office Action dated Mar. 13, 2014 for U.S. Appl. No. 13/862,476.
Office Action dated May 9, 2014 for U.S. Appl. No. 14/106,584.
Office Action dated May 1, 2014 for U.S. Appl. No. 13/862,471.
Office Action dated May 5, 2014 for U.S. Appl. No. 13/862,475.
Search Report dated Apr. 9, 2014 for Taiwanese Application No. 98128358.
Notice of Allowance and Fees dated Jun. 23, 2015 for U.S. Appl. No. 14/578,060.
Office Action dated Jun. 15, 2015 for U.S. Appl. No. 14/578,410.
Office Action dated Jun. 19, 2015 for U.S. Appl. No. 13/862,471.
Office Action dated Jun. 25, 2015 for U.S. Appl. No. 14/552,360.
Office Action dated May 12, 2015 for Korean Patent Application No. 10-2014-7036547.
Official Letter and Search Report dated Apr. 10, 2015 for Taiwanese Patent Application No. 98128034.
Official Letter and Search Report dated Apr. 13, 2015 for Taiwanese Patent Application No. TW 100136720.
Official letter and search report dated Apr. 29, 2015 for Taiwanese Application No. 99127100.
Office Action dated Apr. 15, 2014 for Japanese Patent Application No. 2011-525072.
Office Action dated Jun. 3, 2014 for Japanese Patent Application No. 2012-526931.
Office Action dated Jun. 10, 2014 for Japanese Patent Application No. 2011-525090.
Office Action dated Jun. 10, 2014 for JP Patent Application No. 2011-525073.
Office Action dated Jun. 3, 2014 for Japanese Patent Application No. 2012-535220.
Office Action dated Jun. 6, 2014 for U.S. Appl. No. 13/329,315.
Office Action dated May 13, 2014 for Japanese Patent Application No. 2010-183857.
Office Action dated May 16, 2014 for U.S. Appl. No. 13/948,725.
Office Action dated May 27, 2014 for Japanese Patent Application No. 2012-535223.
Notice of Allowance and Fees dated Aug. 1, 2014 for U.S. Appl. No. 14/108,135.
Notice of Allowance and Fees dated Aug. 15, 2014 for U.S. Appl. No. 13/959,530.
Notice of Allowance and Fees dated Jul. 23, 2014 for U.S. Appl. No. 13/970,465.
Office Action dated Aug. 5, 2014 for Japanese Patent Application No. 2012-525091.
Office Action dated Jul. 15, 2014 for U.S. Appl. No. 13/037,270.
Office Action dated Jul. 8, 2014 for Japanese Patent Application No. 2009-200191.
Office Action dated Oct. 6, 2014 for U.S. Appl. No. 14/331,008.
Official Letter and Search Report dated Aug. 21, 2014 for Taiwanese Patent Application No. 098128359.
Official letter and search report dated Aug. 6, 2014 for Taiwanese Patent Application No. 099127553.
Office action filed on Mar. 17, 2011 for U.S. Appl. No. 12/540,322.
Office Action filed on Mar. 18, 2011 for U.S. Appl. No. 12/540,321.
Office Action filed on Mar. 2, 2011 for U.S. Appl. No. 12/987,994.
Pierrat and Bork, "Impact of Model-Based Fracturing on E-beam Proximity Effect Correction Methodology", Sep. 29, 2010, Proc. of SPIE, vol. 7823, pp. 782313-1-782313-11, Photomask Technology 2010.
Yamada and Yabe, "Variable cell projection as an advance in electron-beam cell projection system", J. Vac. Sci. Technol. B, vol. 22, No. 6, Nov./Dec. 2004, pp. 2917-2922.
European Search Report dated Nov. 17, 2015 for EP Patent Application No. 09810441.7.
Notice of Allowance and Fees dated Oct. 14, 2015 for U.S. Appl. No. 14/552,360.
Notice of Allowance dated Oct. 23, 2015 for U.S. Appl. No. 14/479,520.
Office Action dated Oct. 20, 2015 for U.S Appl. No. 14/454,140.
Office Action dated Oct. 6, 2015 for Japanese Patent Application No. 2013-556643.
Office Action dated Sep. 29, 2015 for U.S. Appl. No. 14/715,136.
Official Letter and Search Report dated Oct. 21, 2015 for Taiwanese Patent Application 101122222.
Quickle et al., Spot Overlap in a Variable Shaped Shpot Electroni Beam Exposure Tool, IP.com Journal, IP.Com Inc., West Henrietta, NY, USA, Jun. 1, 1981 pp. 1-3.
Sakakibara et al., Variable-shaped Electron-Beam Direct Writing Technology for 1-Mum VSI Fabrication, IEEE Transations on Electron Devices, IEEE Service Center, New Jersey, US, vol. 28, No. 11, Nov. 1, 1981, pp. 1279-1284.
Extended European Search Report dated Jul. 20, 2015 for European Patent Application No. 12833285.5.
Extended European Search Report dated Jul. 23, 2015 for European Patent Application No. 12804558.0.
Hagiwara et al., Model-Based Mask Data Preparation (MB-MDP) for ArF and EUV Mask Process Correction, Photomask and Next-Generation Lithography Mask Technology XVIII, SPIE, vol. 8081, No. 1, Apr. 2011, pp. 1-8.
Office Action dated Aug. 18, 2015 for Japanese Patent Application No. 2014-248818.
Office Action dated Aug. 20, 2015 for U.S. Appl. No. 13/862,475.
Office Action dated Jul. 27, 2015 for U.S. Appl. No. 14/331,008.
Office Action dated Jul. 8, 2015 for U.S. Appl. No. 14/479,520.
Office Action dated Sep. 11, 2015 for U.S. Appl. No. 14/739,989.
Office Action dated Sep. 11, 2015 for U.S. Appl. No. 14/177,688.
Office Action dated Sep. 15, 2015 for Japanese Patent Application No. 2014-245829.
Pierrat et al, Mask Data Correction Methodology in the Context of Model-Based Fracturing and Advanced Mask Models, Optical Microlithography XXIV, SPIE, vol. 7973, No. 1, Mar. 2011, pp. 1-11.

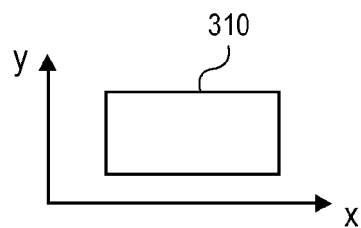
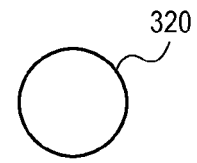
FIG. 3A    FIG. 3B
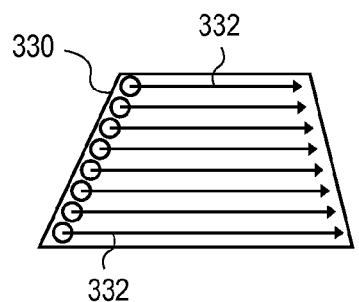
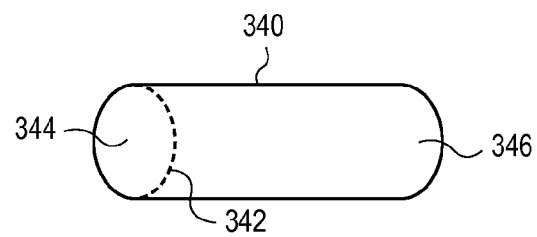
FIG. 3C    FIG. 3D
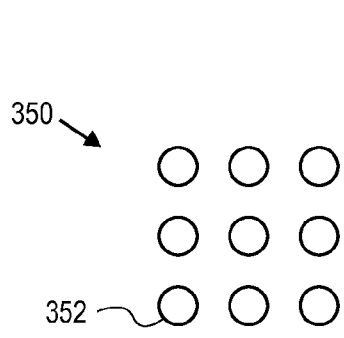
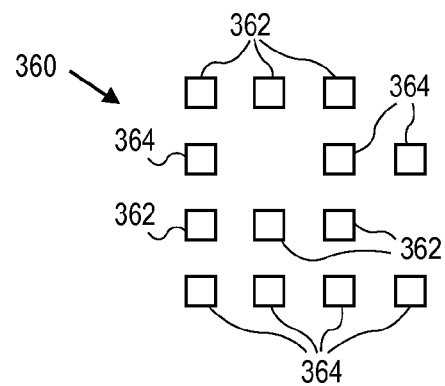
FIG. 3E    FIG. 3F

US 9,323,140 B2

METHOD AND SYSTEM FOR FORMING A PATTERN ON A RETICLE USING CHARGED PARTICLE BEAM LITHOGRAPHY

RELATED APPLICATIONS

This application is a continuation-in-part of U.S. patent application Ser. No. 13/236,610 filed on Sep. 19, 2011, entitled "Method And System For Optimization Of An Image On A Substrate To Be Manufactured Using Optical Lithography", and published as U.S. Patent Application Publication No. US 2013/0070222, which is hereby incorporated by reference for all purposes.

This application is also a continuation-in-part of U.S. patent application Ser. No. 13/970,465 filed on Aug. 19, 2013 entitled "Method and System For Design Of A Reticle To Be Manufactured Using Variable Shaped Beam Lithography" and published as U.S. Patent Application Publication No. US 2013/0337372, which is hereby incorporated by reference for all purposes. U.S. patent application Ser. No. 13/970,465: 1) is a continuation of U.S. patent application Ser. No. 13/650,618 filed on Oct. 12, 2012, entitled "Method And System For Design Of A Reticle To Be Manufactured Using Variable Shaped Beam Lithography" and issued as U.S. Pat. No. 8,512,919; which 2) is a continuation of U.S. patent application Ser. No. 13/316,564 filed on Dec. 12, 2011 entitled "Method And System For Design Of A Reticle To Be Manufactured Using Variable Shaped Beam Lithography" and issued as U.S. Pat. No. 8,304,148, both of which are hereby incorporated by reference for all purposes. U.S. patent application Ser. No. 13/316,564: 3) is a continuation of U.S. patent application Ser. No. 13/087,334 filed on Apr. 14, 2011 entitled "Method and System For Design of a Reticle To Be Manufactured Using Variable Shaped Beam Lithography" and issued as U.S. Pat. No. 8,202,672; 4) which is a continuation of U.S. patent application Ser. No. 12/987,994 filed on Jan. 10, 2011 entitled "Method For Manufacturing a Surface and Integrated Circuit Using Variable Shaped Beam Lithography" and issued as U.S. Pat. No. 8,017,289; 5) which is a continuation of U.S. patent application Ser. No. 12/473,265 filed on May 27, 2009 entitled "Method and System for Design of a Reticle to Be Manufactured Using Variable Shaped Beam Lithography" and issued as U.S. Pat. No. 7,901,850; and 6) which is a continuation-in-part of U.S. patent application Ser. No. 12/202,366 filed Sep. 1, 2008, entitled "Method and System For Design of a Reticle to Be Manufactured Using Character Projection Lithography" and issued as U.S. Pat. No. 7,759,027 and which claims priority to U.S. Provisional Patent Application Ser. No. 61/172,659, filed on Apr. 24, 2009 and entitled "Method for Manufacturing a Surface and Integrated Circuit Using Variable Shaped Beam Lithography"; all of which are hereby incorporated by reference for all purposes.

This application is also related to Fujimura, U.S. patent application Ser. No. 14/177,688, entitled "Method and System For Forming a Pattern On a Reticle Using Charged Particle Beam Lithography," filed on Feb. 11, 2014 even date herewith, which is hereby incorporated by reference for all purposes.

BACKGROUND OF THE DISCLOSURE

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks, or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "Manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection. Shaped beam charged particle beam lithography may use either a single shaped beam, or may use a plurality of shaped beams simultaneously exposing the surface, the plurality of shaped beams producing a higher writing speed than a single shaped beam.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs." Serifs are small features that can be positioned on an interior or exterior corner of a pattern to sharpen the corner in the final transferred image. It is often the case that the precision demanded of the surface manufacturing process for SRAFs is less than the precision demanded for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations such as corner rounding will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask. As process nodes continue to shrink, the size of the smallest SRAFs on a photomask also shrinks. For example, at the 20 nm logic process node, 40 nm to 60 nm SRAFs are needed on the mask for the highest precision layers.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the substrate as input. ILT-computed reticle patterns may be purely curvilinear—i.e. completely non-rectilinear—and may include circular, nearly circular, annular, nearly annular, oval and/or nearly oval patterns. Since these ideal ILT curvilinear patterns are difficult and expensive to form on a reticle using conventional techniques, rectilinear approximations or rectilinearizations of the curvilinear patterns may be used. The rectilinear approximations decrease accuracy, however, compared to the ideal ILT curvilinear patterns. Additionally, if the rectilinear approximations are produced from the ideal ILT curvilinear patterns, the overall calculation time is increased compared to ideal ILT curvilinear patterns. In this disclosure ILT, OPC, source mask optimization (SMO), and computational lithography are terms that are used interchangeably.

EUV optical lithography has a much higher resolution than conventional optical lithography. The very high resolution of EUV significantly reduces the need for OPC processing, resulting in lower mask complexity for EUV than for 193 nm optical lithography. However, because of the very high resolution of EUV, imperfections in a photomask, such as excessive line edge roughness (LER), will be transferred to the wafer. Therefore, the accuracy requirements for EUV masks are higher than those for conventional optical lithography. Additionally, even though EUV mask shapes are not complicated by the addition of complex SRAFs or serifs required for conventional 193 nm lithography, EUV mask shapes are complicated by an addition of some complexities unique to EUV manufacturing. Of particular relevance in writing patterns on masks for EUV lithography is mid-range scattering of charged particles such as electrons, which may affect a radius of about 2 um. This midrange scattering introduces a new consideration for mask data preparation, because for the first time the influence from neighboring patterns has significant impact on the shape that a particular pattern would cast onto the mask surface. Previously, when exposing masks for use with conventional 193 nm lithography, the short-range scattering affected only the pattern being written, and the long-range scattering had a large enough effective range that only the size of a pattern, and not its detailed shape, was affected, making it possible to make corrections by only using dose modulation. In addition, since EUV processing of wafers is more expensive, it is desirable to reduce or eliminate multiple patterning. Multiple patterning is used in conventional optical lithography to allow exposure of small features by exposing patterns for one layer of wafer processing using multiple masks, each of which contains a portion of the layer pattern. Reducing or eliminating multiple exposures requires the single mask to contain more fine patterns. For example, a series of collinear line segments may be double-patterned by first drawing a long line, then cutting the line into line segments by a second mask in conventional lithography. The same layer written with a single mask, such as for EUV lithography, would require a mask containing many smaller line segments. The need to write larger numbers of finer patterns on a single mask, each pattern needing to be more accurate, increases the need for precision on EUV masks.

There are a number of technologies used for forming patterns on a reticle, including using optical lithography or charged particle beam lithography. The most commonly used system is the variable shaped beam (VSB), where, as described above, doses of electrons with simple shapes such as Manhattan rectangles and 45-degree right triangles expose a resist-coated reticle surface. In conventional mask writing, the doses or shots of electrons are designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count or higher accuracy or both. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

Current optical lithography writing machines typically reduce the photomask pattern by a factor of four during the optical lithographic process. Therefore, patterns formed on a reticle or mask must be four times larger than the size of the desired pattern on the substrate or wafer.

SUMMARY OF THE DISCLOSURE

A method and system for fracturing or mask data preparation is disclosed in which a plurality of charged particle beam shots is determined which will produce a pattern on a reticle, where the reticle is to be used to form an aerial image on a resist-coated substrate using an optical lithographic process. A simulated reticle pattern is then calculated from the plurality of charged particle beam shots. A calculated aerial substrate image is then calculated using the simulated reticle pattern, and a shot in the plurality of shots is modified to improve the calculated aerial substrate image. Similar methods for forming a pattern on a reticle and for manufacturing an integrated circuit are also disclosed.

BRIEF DESCRIPTION OF THE DRAWINGS

FIG. 3A illustrates an example of a rectangular shot;

FIG. 3B illustrates an example of a circular character projection shot;

FIG. 3C illustrates an example of a trapezoidal shot;

FIG. 3D illustrates an example of a dragged shot;

FIG. 3E illustrates an example of a shot which is an array of circular patterns;

FIG. 3F illustrates an example of a shot which is a sparse array of rectangular patterns;

DETAILED DESCRIPTION OF THE EMBODIMENTS

The present disclosure is related to lithography, and more particularly to the design and manufacture of a surface which may be a reticle, a wafer, or any other surface, using charged particle beam lithography.

Figure 1:
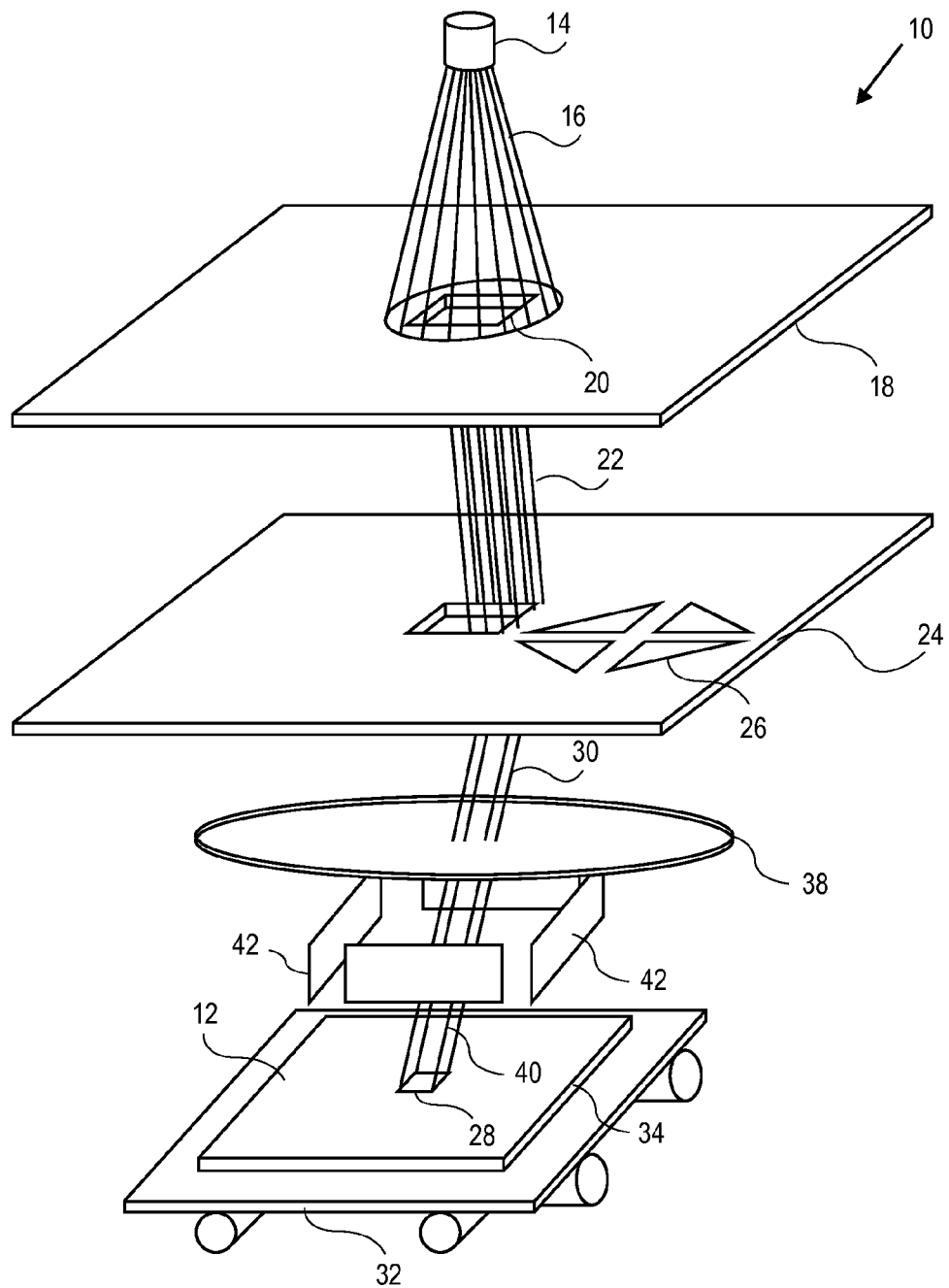
FIG. 1 illustrates an example of a charged particle beam system.

Referring now to the drawings, wherein like numbers refer to like items, FIG. 1 illustrates an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil 24 has formed therein a number of openings or apertures 26 that define various simple shapes such as rectangles and triangles. Each aperture 26 formed in the stencil 24 may be used to form a pattern in the surface 12 of a substrate 34, such as a silicon wafer, a reticle or other substrate. An electron beam 30 emerges from one of the apertures 26 and passes through an electromagnetic or electrostatic reduction lens 38, which reduces the size of the pattern emerging from the aperture 26. In commonly available charged particle beam writer systems, the reduction factor is between 10 and 60. The reduced electron beam 40 emerges from the reduction lens 38 and is directed by a series of deflectors 42 onto the surface 12 as a pattern 28. The surface 12 is coated with resist (not shown) which reacts with the electron beam 40. The electron beam 22 may be directed to overlap a variable portion of an aperture 26, affecting the size and shape of the pattern 28. Blanking plates (not shown) are used to deflect the beam 16 or the shaped beam 22 so to prevent the electron beam from reaching the surface 12 during a period after each shot when the lenses directing the beam 22 and the deflectors 42 are being re-adjusted for the succeeding shot. Typically the blanking plates are positioned so as to deflect the electron beam 16 to prevent it from illuminating aperture 20. Conventionally, the blanking period may be a fixed length of time, or it may vary depending, for example, on how much the deflector 42 must be re-adjusted for the position of the succeeding shot.

In electron beam writer system 10, the substrate 34 is mounted on a movable platform or stage 32. The stage 32 allows substrate 34 to be repositioned so that patterns which are larger than the maximum deflection capability or field size of the charged particle beam 40 may be written to surface 12 in a series of subfields, where each subfield is within the capability of deflector 42 to deflect the beam 40. In one embodiment the substrate 34 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate (not illustrated).

Figure 2:
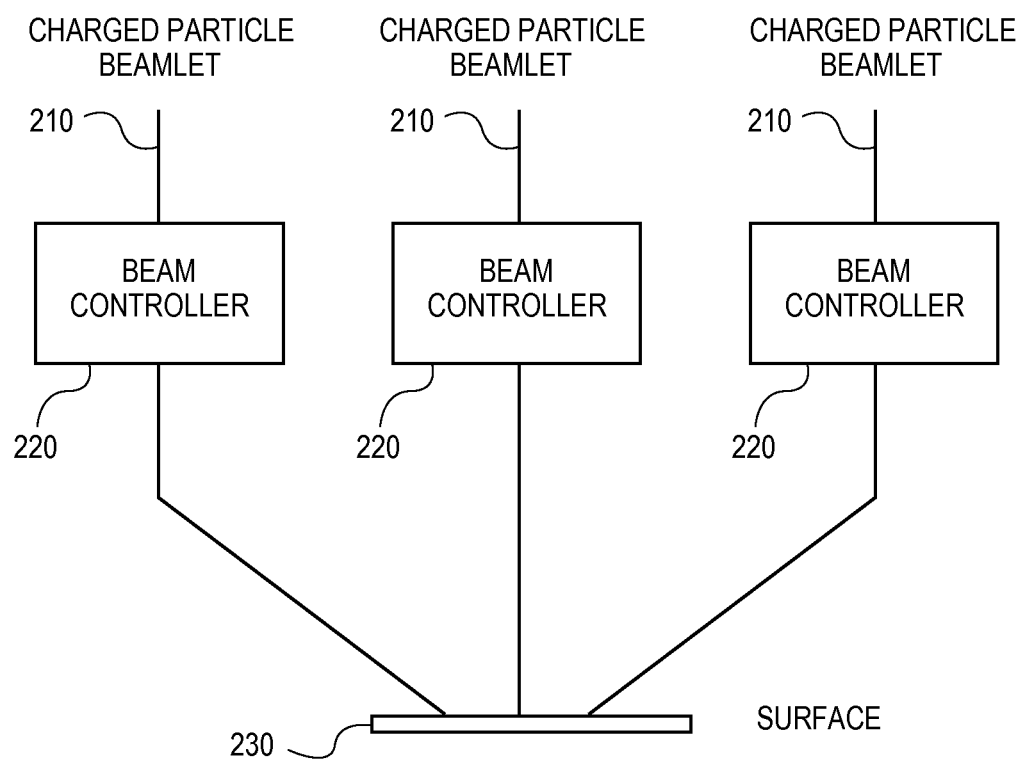
FIG. 2 illustrates an example of an electro-optical schematic diagram of a multi-beam exposure system.

A charged particle beam system may expose a surface with a plurality of individually-controllable beams or beamlets. FIG. 2 illustrates an electro-optical schematic diagram in which there are three charged particle beamlets 210. Associated with each beamlet 210 is a beam controller 220. Each beam controller 220 can, for example, allow its associated beamlet 210 to strike surface 230, and can also prevent beamlet 210 from striking the surface 230. In some embodiments, beam controller 220 may also control beam blur, magnification, size and/or shape of beamlet 210. In this disclosure, a charged particle beam system which has a plurality of individually-controllable beamlets is called a multi-beam system.

In some embodiments, charged particles from a single source may be sub-divided to form a plurality of beamlets 210. In other embodiments a plurality of sources may be used to create the plurality of beamlets 210. In some embodiments, beamlets 210 may be shaped by one or more apertures, whereas in other embodiments there may be no apertures to shape the beamlets. Each beam controller 220 may allow the period of exposure of its associated beamlet to be controlled individually. Generally the beamlets will be reduced in size by one or more lenses (not shown) before striking the surface 230, which will typically be coated with a resist. In some embodiments each beamlet may have a separate electro-optical lens, while in other embodiments a plurality of beamlets, including possibly all beamlets, will share an electro-optical lens.

For purposes of this disclosure, a shot is the exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams. FIG. 3 illustrates some various types of shots. FIG. 3A illustrates an example of a rectangular shot 310. A VSB charged particle beam system can, for example, form rectangular shots in a variety of x and y dimensions. FIG. 3B illustrates an example of a character projection (CP) shot 320, which is circular in this example. FIG. 3C illustrates an example of a trapezoidal shot 330. In one embodiment, shot 330 may be a created using a raster-scanned charged particle beam, where the beam is scanned, for example, in the x-direction as illustrated with scan lines 332. FIG. 3D illustrates an example of a dragged shot 340, disclosed in U.S. Patent Application Publication 2011-0089345. Shot 340 is formed by exposing the surface with a curvilinear shaped beam 342 at an initial reference position 344, and then moving the shaped beam across the surface from position 344 to position 346. A dragged shot path may be, for example, linear, piecewise linear, or curvilinear.

FIG. 3E illustrates an example of a shot 350 that is an array of circular patterns 352. Shot 350 may be formed in a variety of ways, including multiple shots of a single circular CP character, one or more shots of a CP character which is an array of circular apertures, and one or more multi-beam shots using circular apertures. FIG. 3F illustrates an example of a shot 360 that is a sparse array of rectangular patterns 362 and 364. Shot 360 may be formed in a variety of ways, including a plurality of VSB shots, a CP shot, and one or more multi-beam shots using rectangular apertures. In some embodiments of multi-beam, shot 360 may comprise a plurality of interleaved groups of other multi-beam shots. For example, patterns 362 may be shot simultaneously, then patterns 364 may be shot simultaneously at a time different from patterns 362.

Figure 4:
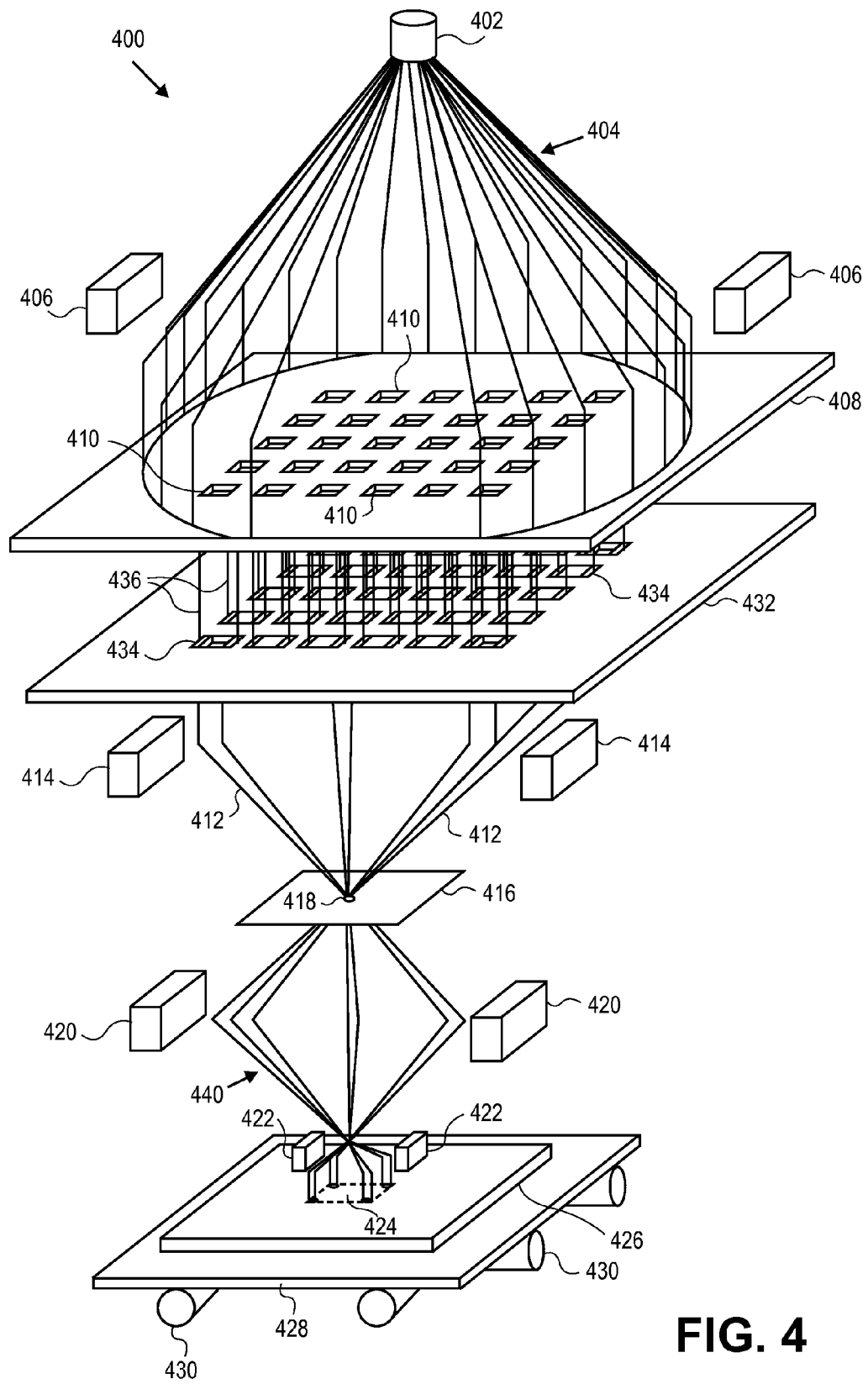
FIG. 4 illustrates an example of a multi-beam charged particle beam system.

FIG. 4 illustrates an embodiment of a charged particle beam exposure system 400. Charged particle beam system 400 is a multi-beam system, in which a plurality of individually-controllable shaped beams can simultaneously expose a surface. Multi-beam system 400 has an electron beam source 402 that creates an electron beam 404. The electron beam 404 is directed toward aperture plate 408 by condenser 406, which may include electrostatic and/or magnetic elements. Aperture plate 408 has a plurality of apertures 410 which are illuminated by electron beam 404, and through which electron beam 404 passes to form a plurality of shaped beamlets 436. In some embodiments, aperture plate 408 may have hundreds or thousands of apertures 410. Although FIG. 4 illustrates an embodiment with a single electron beam source 402, in other embodiments apertures 410 may be illuminated by electrons from a plurality of electron beam sources. Apertures 410 may be rectangular, or may be of a different shape, for example circular. The set of beamlets 436 then illuminates a blanking controller plate 432. The blanking controller plate 432 has a plurality of blanking controllers 434, each of which is aligned with a beamlet 436. Each blanking controller 434 can individually control its associated beamlet 436, so as to either allow the beamlet 436 to strike surface 424, or to prevent the beamlet 436 from striking the surface 424. The amount of time for which the beam strikes the surface controls the total energy or "dose" applied by that beamlet. Therefore, the dose of each beamlet may be independently controlled.

In FIG. 4 beamlets that are allowed to strike surface 424 are illustrated as beamlets 412. In one embodiment, the blanking controller 434 prevents its beamlet 436 from striking the surface 424 by deflecting beamlet 436 so that it is stopped by an aperture plate 416 which contains an aperture 418. In some embodiments, blanking plate 432 may be directly adjacent to aperture plate 408. In other embodiments, the relative locations of aperture plate 408 and blanking controller 432 may be reversed from the position illustrated in FIG. 4, so that beam 404 strikes the plurality of blanking controllers 434. A system of lenses comprising elements 414, 420, and 422 allows projection of the plurality of beamlets 412 onto surface 424 of substrate 426, typically at a reduced size compared to the plurality of apertures 410. The reduced-size beamlets form a beamlet group 440 which strikes the surface 424 to form a pattern that matches a pattern of a subset of apertures 410, the subset being those apertures 410 for which corresponding blanking controllers 434 allow beamlets 436 to strike surface 424. In FIG. 4, beamlet group 440 has four beamlets illustrated for forming a pattern on surface 424.

Substrate 426 is positioned on movable platform or stage 428, which can be repositioned using actuators 430. By moving stage 428, beam 440 can expose an area larger than the dimensions of the maximum size pattern formed by beamlet group 440, using a plurality of exposures or shots. In some embodiments, the stage 428 remains stationary during an exposure, and is then repositioned for a subsequent exposure. In other embodiments, stage 428 moves continuously and at a variable velocity. In yet other embodiments, stage 428 moves continuously but at a constant velocity, which can increase the accuracy of the stage positioning. For those embodiments in which stage 428 moves continuously, a set of deflectors (not shown) may be used to move the beam to match the direction and velocity of stage 428, allowing the beamlet group 440 to remain stationary with respect to surface 424 during an exposure. In still other embodiments of multi-beam systems, individual beamlets in a beamlet group may be deflected across surface 424 independently from other beamlets in the beamlet group.

Other types of multi-beam systems may create a plurality of unshaped beamlets 436, such as by using a plurality of charged particle beam sources to create an array of Gaussian beamlets.

Referring again for FIG. 1, the minimum size pattern that can be projected with reasonable accuracy onto a surface 12 is limited by a variety of short-range physical effects associated with the electron beam writer system 10 and with the surface 12, which normally comprises a resist coating on the substrate 34. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a charged particle beam writer such as an electron beam writer system is a function of the intensity of the beam source 14 and the exposure time for each shot. Typically the beam intensity remains fixed, and the exposure time is varied to obtain variable shot dosages. Different areas in a shot may have different exposure times, such as in a multi-beam shot. The exposure time may be varied to compensate for various long-range effects such as backscatter, fogging, and loading effects in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels.

The mechanisms within electron beam writers have a relatively coarse resolution for calculations. As such, mid-range corrections such as may be required for EUV masks in the range of 2 µm cannot be computed accurately by current electron beam writers.

Conventionally, shots are designed so as to completely cover an input pattern with rectangular shots, while avoiding shot overlap wherever possible. Also, all shots are designed to have a normal dosage, which is a dosage at which a relatively large rectangular shot, in the absence of long-range effects, will produce a pattern on the surface which is the same size as is the shot size.

In exposing, for example, a repeated pattern on a surface using charged particle beam lithography, the size of each pattern instance, as measured on the final manufactured surface, will be slightly different, due to manufacturing variations. The amount of the size variation is an essential manufacturing optimization criterion. In current mask masking, a root mean square (RMS) variation of no more than 1 nm (1 sigma) in pattern size may be desired. More size variation translates to more variation in circuit performance, leading to higher design margins being required, making it increasingly difficult to design faster, lower-power integrated circuits. This variation is referred to as critical dimension (CD) variation. A low CD variation is desirable, and indicates that manufacturing variations will produce relatively small size variations on the final manufactured surface. In the smaller scale, the effects of a high CD variation may be observed as line edge roughness (LER). LER is caused by each part of a line edge being slightly differently manufactured, leading to some waviness in a line that is intended to have a straight edge. CD variation is, among other things, inversely related to the slope of the dosage curve at the resist threshold, which is called edge slope. Therefore, edge slope, or dose margin, is a critical optimization factor for particle beam writing of surfaces. In this disclosure, edge slope and dose margin are terms that are used interchangeably.

With conventional fracturing, without shot overlap, gaps or dose modulation, the dose margin of the written shapes is considered immutable: that is, there is no opportunity to improve dose margin by a choice of fracturing options. In modern practice, the avoidance of very narrow shots called slivers is an example of a practical rule-based method that helps to optimize the shot list for dose margin.

In a fracturing environment where overlapping shots and dose-modulated shots can be generated, there is both a need and an opportunity to optimize for dose margin. The additional flexibility in shot combinations allowed by use of shot overlap and dose modulation allows generation of fracturing solutions that appear to generate the target mask shapes on the surface, but may do so only under perfect manufacturing conditions. The use of overlapping shots and dose-modulated shots therefore creates incentive to address the issue of dose margin and its improvement.

Figure 5A:
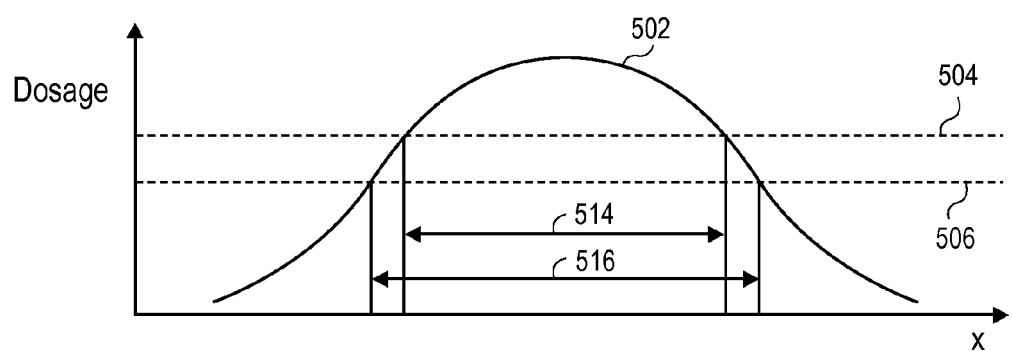
FIG. 5A illustrates an example of a cross-sectional dosage graph, showing registered pattern widths for each of two resist thresholds.
Figure 5B:
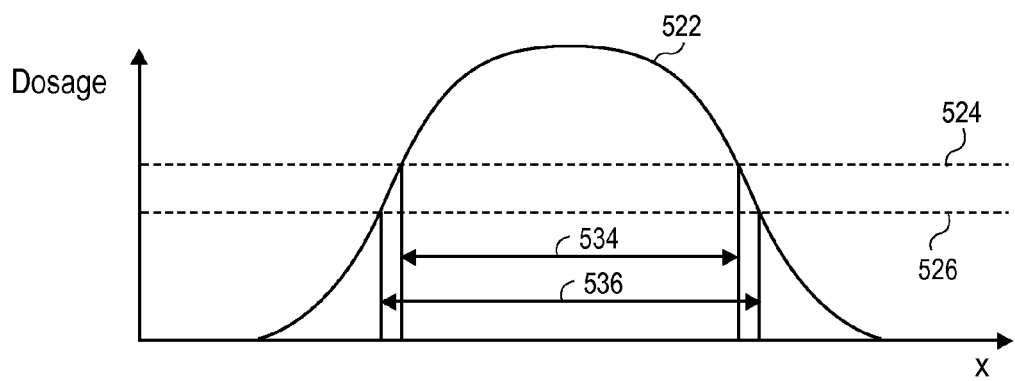
FIG. 5B illustrates an example of a cross-sectional dosage graph similar to FIG. 5A, but with a higher dosage edge slope than in FIG. 5A.

FIGS. 5A-B illustrate how critical dimension variation can be reduced by exposing the pattern on the resist so as to produce a relatively high edge slope in the exposure or dosage curve, such as is described in U.S. Pat. No. 8,473,875, entitled "Method and System for Forming High Accuracy Patterns Using Charged Particle Beam Lithography," which is hereby incorporated by reference for all purposes. FIG. 5A illustrates a cross-sectional dosage curve 502, where the x-axis shows the cross-sectional distance through an exposed pattern—such as the distance perpendicular to two of the pattern's edges—and the y-axis shows the dosage received by the resist. A pattern is registered by the resist where the received dosage is higher than a threshold. Two thresholds are illustrated in FIG. 5A, illustrating the effect of a variation in resist sensitivity. The higher threshold 504 causes a pattern of width 514 to be registered by the resist. The lower threshold 506 causes a pattern of width 516 to be registered by the resist, where width 516 is greater than width 514. FIG. 5B illustrates another cross-sectional dosage curve 522. Two thresholds are illustrated, where threshold 524 is the same as threshold 504 of FIG. 5A, and threshold 526 is the same as threshold 506 of FIG. 5A. The slope of dosage curve 522 is higher in the vicinity of the two thresholds than is the slope of dosage curve 502. For dosage curve 522, the higher threshold 524 causes a pattern of width 534 to be registered by the resist. The lower threshold 526 causes a pattern of width 536 to be registered by the resist. As can be seen, the difference between width 536 and width 534 is less than the difference between width 516 and width 514, due to the higher edge slope of dosage curve 522 compared to dosage curve 502. If the resist-coated surface is a reticle, then the lower sensitivity of curve 522 to variation in resist threshold can cause the pattern width on a photomask manufactured from the reticle to be closer to the target pattern width for the photomask, thereby increasing the yield of usable integrated circuits when the photomask is used to transfer a pattern to a substrate such as a silicon wafer. Similar improvement in tolerance to variation in dose for each shot is observed for dose curves with higher edge slopes. Achieving a relatively higher edge slope such as in dosage curve 522 is therefore desirable.

As described above, process variations can cause the width of a pattern on a photomask to vary from the intended or target width. The pattern width variation on the photomask will cause a pattern width variation on a wafer which has been exposed using the photomask in an optical lithographic process. The sensitivity of the wafer pattern width to variations in photomask pattern width is called mask edge error factor, or MEEF. In an optical lithography system using a 4× photomask, where the optical lithographic process projects a 4× reduced version of the photomask pattern onto the wafer, a MEEF of 1, for example means that for each 1 nm error in pattern width on a photomask, the pattern width on the wafer will change by 0.25 nm. A MEEF of 2 means that for a 1 nm error in photomask pattern width, the pattern width on the wafer will change by 0.5 nm. For the smallest integrated circuits processes, MEEF may be greater than 2.

Figure 6A:
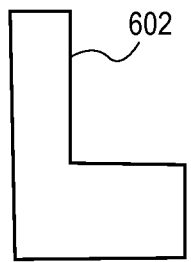
FIG. 6A illustrates an example of a designed pattern from a computer-aided design (CAD) system.
Figure 6B:
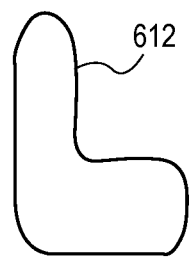
FIG. 6B illustrates an example of an image that is desired to be formed on a wafer from the CAD pattern of FIG. 6A.
Figure 6C:
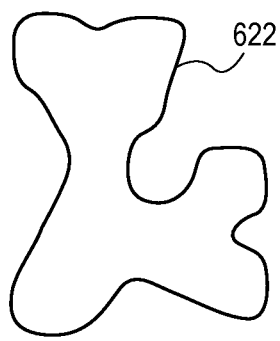
FIG. 6C illustrates an example of an OPC-calculated pattern for a reticle, which is intended to form the pattern of FIG. 6B on the wafer.
Figure 6D:
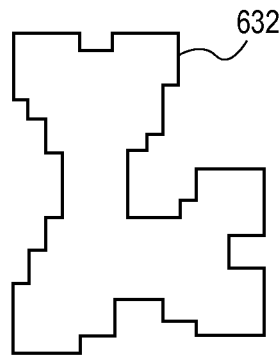
FIG. 6D illustrates an example of a rectilinearized version of the pattern of FIG. 6C.
Figure 7D:
FIG. 7D illustrates an example of a wafer pattern calculated from the wafer aerial image of FIG. 7C.

FIG. 6A illustrates an example of a computer-aided design (CAD) pattern 602, that is a pattern that was output from a CAD system. As can be seen, all edges of CAD pattern 602 are Manhattan, and all corners are square. Although patterns output from a CAD system commonly have square corners, it is well-known that square corners, for example, cannot be formed on a wafer using conventional optical lithographic technology. FIG. 6B illustrates an example of a pattern 612 which is a target image for the wafer, based on the CAD pattern 602. Target wafer image 612 is the curvilinear image that is realistically desired to be formed on the wafer. FIG. 6C illustrates an example of a target pattern 622 for a reticle that, if used in an optical lithographic process, can form an image similar to image 612 on a wafer. The pattern 622 may be, in general, the output of an OPC process. In some embodiments, pattern 622 may be the output of an ILT process which creates ideal curvilinear shapes for the reticle patterns. It is, however, difficult to generate a set of conventional non-overlapping VSB shots which will form a curvilinear pattern such as pattern 622 on a reticle. Therefore, an ILT post-processing step may be done to rectilinearize the pattern 622, which is to say create a rectilinear pattern, such as the FIG. 6D pattern 632, which can form a wafer image that is close to the target wafer image 612. Rectilinearized ILT patterns are more easily fractured using conventional non-overlapping shots than are ideal curvilinear ILT patterns. As described above, rectilinearization has two disadvantages, however: 1) rectilinearlization is a compute-intensive process and is therefore slow, and 2) the image that can be formed on the wafer using a rectilinearized pattern such as pattern 632 may not be as close to the target wafer image 612 as if a reticle with the ideal pattern 622 had been used. Related to 2), a reticle made with the rectilinearized pattern may have poorer manufacturability than a reticle made using the ideal curvilinear ILT pattern.

Use of model-based fracturing allows generation of a set of shots that can form a pattern such as the curvilinear pattern 622 with higher accuracy and/or with fewer shots than using conventional non-overlapping VSB shots. In some embodiments, the pattern formed by a set of shots is calculated. In model-based fracturing, shots may overlap, and if assigned shot dosages are supported by the particle beam exposure system, different shots may have different dosages before correction for long range effects, called proximity effect correction or PEC. When used with ILT, model-based fracturing of ideal curvilinear ILT patterns such as pattern 622 may be done, obviating the need for rectilinearization. Model-based fracturing may be used with VSB, CP, and also with multi-beam exposure. In model-based fracturing for multi-beam, different parts of a multi-beam shot, such as different beamlets, may have different assigned dosages before PEC correction.

Figure 7B:
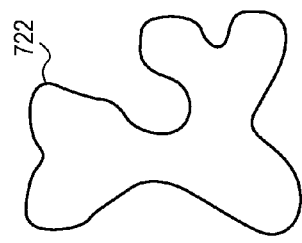
FIG. 7B illustrates an example of a calculated reticle pattern that may be formed from the set of shots of FIG. 7A.
Figure 7A:
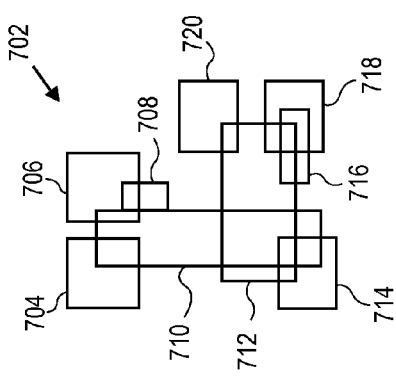
FIG. 7A illustrates an example of a set of shots.

FIG. 7A illustrates an example of a set of overlapping shots 702 that may be generated to form the pattern 622 of FIG. 6C. Set of shots 702 consists of nine VSB shots: shot 704, shot 706, shot 708, shot 710, shot 712, shot 714, shot 716, shot 718, and shot 720. FIG. 7B illustrates an example of a pattern 722 that can be produced on a reticle using the set of shots 702. Reticle pattern 722 may be simulated, so as to determine its shape before manufacturing the reticle and photomask. Simulation, that is, calculation, of the effects contributing to formation of reticle pattern 722 from set of shots 702 requires consideration of many effects, which may be organized into two groups:

Phenomena which are associated with the particle beam exposure itself. Effects that may be simulated include forward scattering, backward scattering, resist diffusion, Coulomb effect, fogging, loading and resist charging. Simulation of these effects is called charged particle beam simulation.

Phenomena that follow the particle beam exposure process. These include the resist baking process, the resist development process, and the etch process. Simulation of these effects is called mask process simulation. The simplest form, which is contemplated in this disclosure, is calculating a bias from the substrate aerial image, using, for example, a constant or a rule-based bias model.

In some embodiments of the present disclosure, simulation of the reticle pattern is followed by simulation of a wafer aerial image using the simulated reticle pattern. The reticle pattern simulation and wafer aerial image simulation steps together are called double simulation in this disclosure. In other embodiments, the effects of wafer resist post-exposure processes such as development and etch are also simulated, which is called wafer process simulation. The simplest form of wafer process simulation is a constant or a rule-based bias model which is contemplated in this disclosure.

Figure 9:
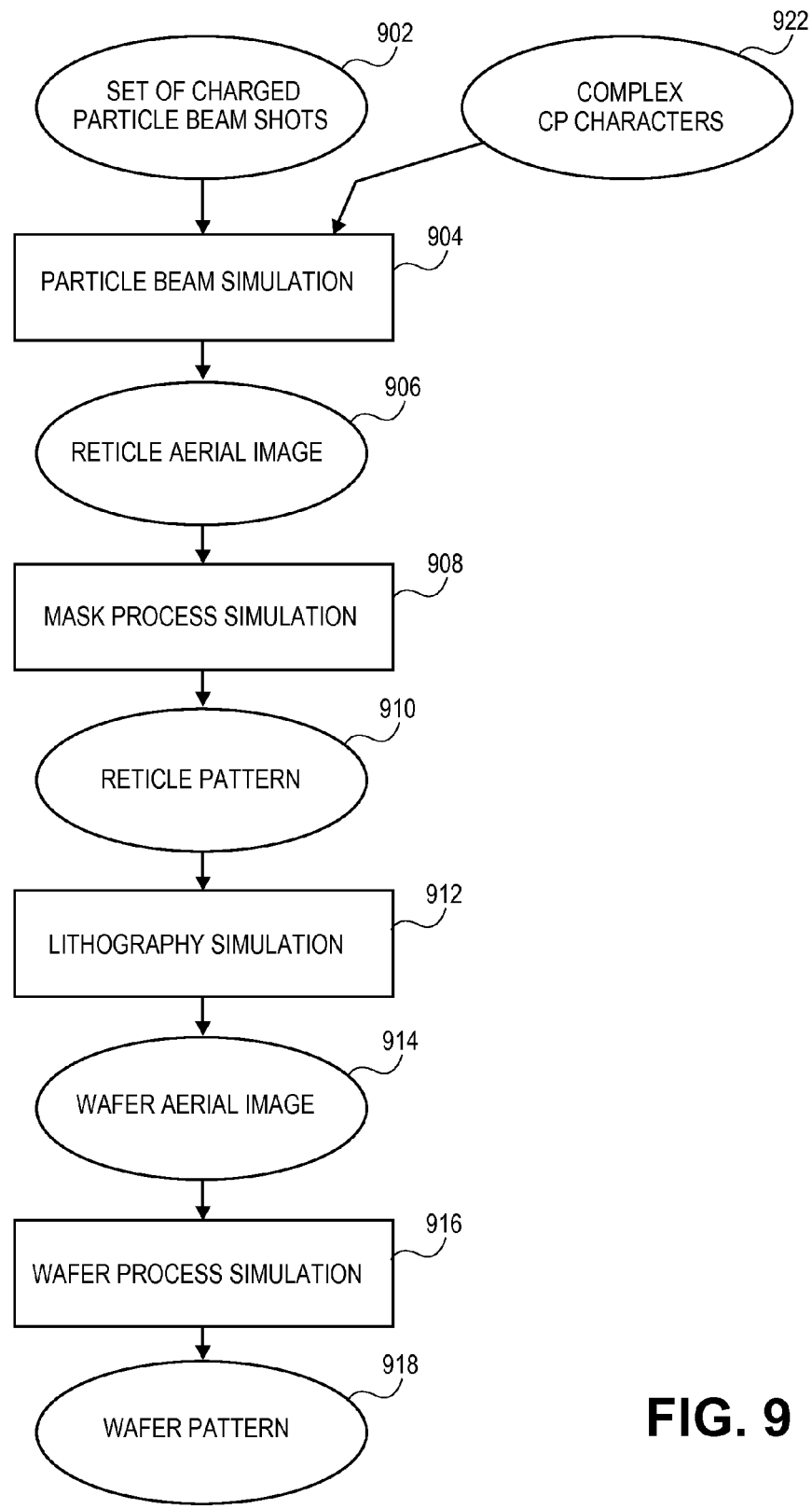
FIG. 9 illustrates an embodiment of a conceptual flow diagram for performing double simulation.

The conceptual flow diagram FIG. 9 illustrates double simulation. The input to the process is a set of charged particle beam shots 902, such as set of shots 702. In some embodiments the shots in set of shots 902 are VSB characters. In other embodiments, where some shots in the set of shots 902 are complex character shots, a library of complex CP characters 922 is also input. In yet other embodiments, shots in set of shots 902 are multi-beam shots. In step 904 charged particle beam simulation is performed. Effects that may be simulated include forward scattering, backward scattering, resist diffusion, Coulomb effect, fogging, loading and resist charging. The output of charged particle beam simulation is a reticle aerial image 906. In step 908, mask process simulation simulates the effect of various post-exposure processes to create a simulated reticle pattern 910. Mask process simulation 908 may include simulation of resist baking, resist development and etch. Charged particle beam simulation 904 and mask process simulation 908 may be bundled together into a single step, or in other embodiments may be separate steps. In step 912 lithography simulation calculates a wafer aerial image 914 that will be formed on a substrate such as a wafer using an optical lithographic process with the simulated reticle pattern 910. In some embodiments, wafer process simulation 916 is performed on the wafer aerial image 914, to create a simulated wafer pattern 918. Wafer process simulation 916 may include simulation of resist baking, resist development and etch. Lithography simulation 912 and wafer process simulation 916 may be bundled together into a single step, or in other embodiments may be separate steps.

Referring to FIGS. 7A-D, charged particle beam simulation and mask process simulation may be used to calculate a reticle pattern 722 that will be formed from set of shots 702. Reticle pattern 722 may then be used as input to lithography simulation to calculate a wafer aerial image, illustrated in FIG. 7C element 732. In some embodiments, wafer aerial image 732 may be compared with target wafer image 612. In one embodiment, the present methods comprise comparing the simulated wafer aerial image 732 with target wafer image 612, and then modifying shots in group of shots 702, such as with an optimization process, so as to reduce the difference between the simulated wafer aerial image 732 and the target wafer image 612. In other embodiments, the present methods additionally comprise performing wafer process simulation on the wafer aerial image, to calculate a wafer pattern illustrated in FIG. 7D element 742. The wafer pattern 742 may be compared with target wafer image 612. In one embodiment, the present methods comprise comparing the simulated wafer pattern 742 with target wafer image 612, and then modifying shots in group of shots 702, such as with an optimization process, so as to reduce the difference between the wafer pattern 742 and the target wafer image 612.

Figure 8D:
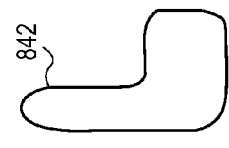
FIG. 8D illustrates an example of a wafer pattern calculated from the wafer aerial image of FIG. 8C.
Figure 7C:
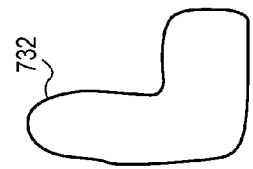
FIG. 7C illustrates an example of a wafer aerial image calculated from the reticle pattern of FIG. 7B.
Figure 8C:
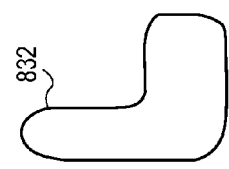
FIG. 8C illustrates an example of a wafer aerial image calculated from the reticle pattern of FIG. 8B.
Figure 8B:
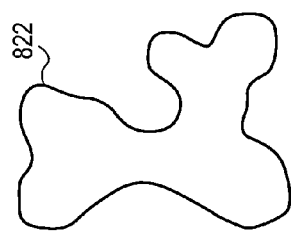
FIG. 8B illustrates an example of a calculated reticle pattern that may be formed from the set of shots of FIG. 8A.
Figure 8A:
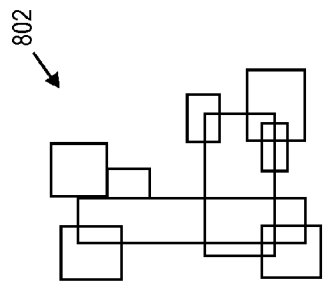
FIG. 8A illustrates an example of a set of shots, modified from the set of shots of FIG. 7A.

FIG. 8A illustrates an example of a set of shots 802 that may result from modifying the set of shots 702. Like set of shots 702, set of shots 802 contains nine VSB shots, but many of the shots in set of shots 802 have different positions and/or sizes compared to the corresponding shots in set of shots 702. FIG. 8B illustrates an example of a simulated reticle pattern 822 that may result from set of shots 802. Charged particle beam simulation and mask process simulation may be used to calculate pattern 822 from set of shots 802. FIG. 8C illustrates a calculated wafer aerial image 832 which can be calculated from reticle pattern 822 through the use of lithography simulation. Simulated wafer aerial image 832 is closer to the target wafer image 612 than is simulated wafer aerial image 732. In some embodiments, wafer process simulation may be used to calculate a wafer pattern, illustrated as FIG. 8D image 842, from wafer aerial image 832.

In another embodiment, shot modification such as is illustrated in set of shots 802 may be done so as to improve any of a variety of wafer manufacturability characteristics associated with a patterned reticle, such as a reticle containing the pattern 822. These manufacturability characteristics include process variation (PV) band, depth of field, mask edge error factor (MEEF), CD variation, edge placement error (EPE), and area variation. Manufacturability improvement can allow the pattern produced on the wafer to be closer to the target wafer image 612 through a wider range of process variations than if the unmodified set of shots 702 had been used. Manufacturability improvement may, for example, increase the yield of good wafers in the face of manufacturing process variations. Optimization techniques may be used to determine the shot modifications.

Figure 10:
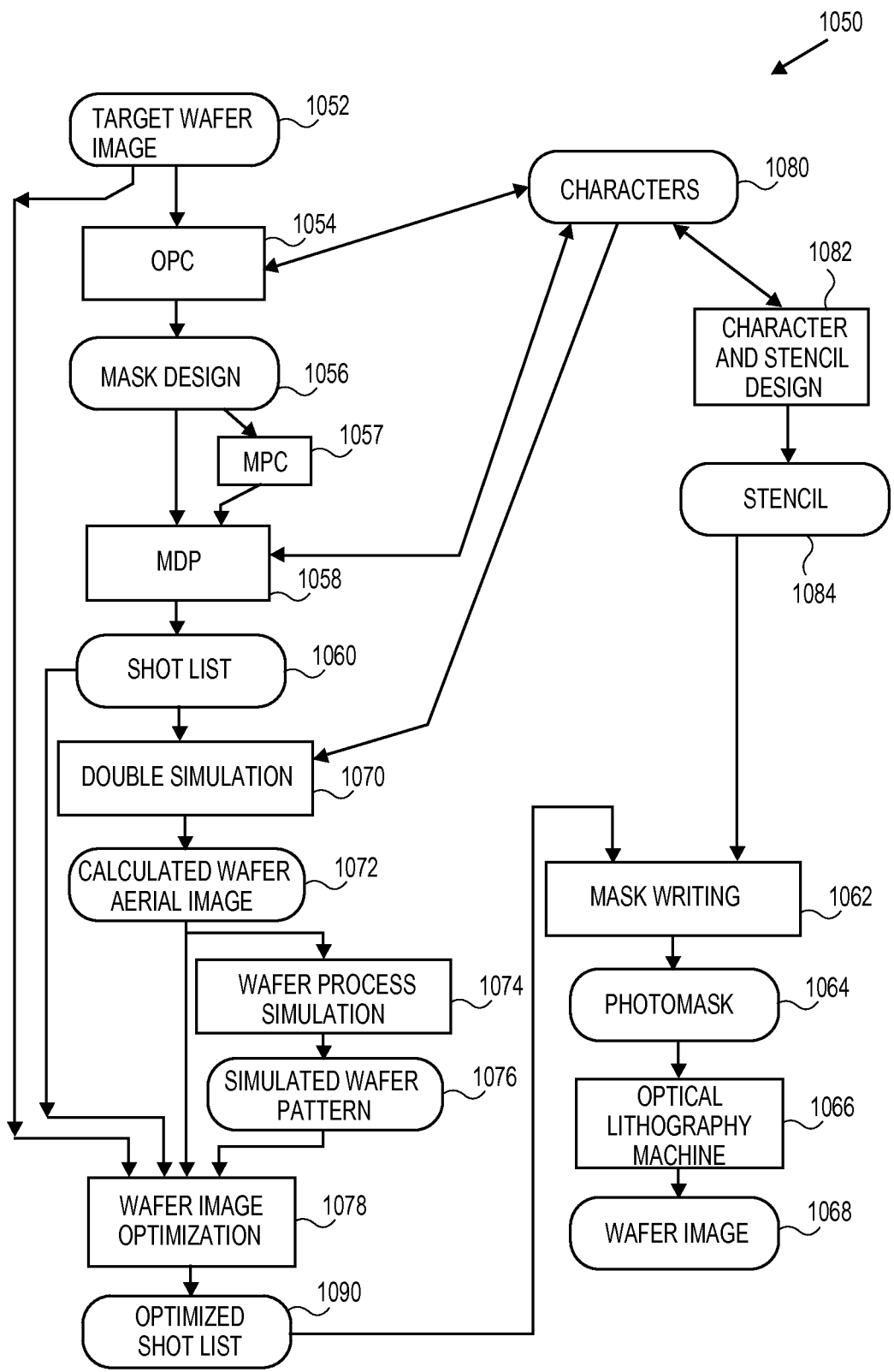
FIG. 10 illustrates an embodiment of a conceptual flow diagram for preparing a surface in fabricating a substrate such as an integrated circuit on a silicon wafer.

FIG. 10 is a conceptual flow diagram 1050 of how to prepare a reticle for use in fabricating a surface such as an integrated circuit on a silicon wafer, according to an embodiment of the present disclosure. The input to the flow is a target wafer image 1052, obtained from a CAD pattern such as a physical design of an integrated circuit. Next, in a step 1054, optical proximity correction (OPC) is determined. In an embodiment of this disclosure, step 1054 can include taking as input a library of pre-designed characters 1080 including complex characters that are to be available on a stencil 1084 in a mask writing step 1062. Stencil 1084 may be pre-designed for use by multiple designs, and the use of characters 1080 is optimized by OPC 1054 and/or MDP 1058. In an embodiment of this disclosure, an OPC step 1054 may also include simultaneous optimization of shot count or write times, and may also include a fracturing operation, a shot placement operation, a dose assignment operation, or may also include a shot sequence optimization operation, or other mask data preparation (MDP) operations, with some or all of these operations being simultaneous or combined in a single step. The OPC step 1054 may create partially or completely curvilinear patterns. In an embodiment of this disclosure, the OPC step 1054 may comprise ILT which creates ideal curvilinear ILT patterns. In another embodiment of this disclosure, the OPC step 1054 may comprise ILT which creates rectilinearized ILT patterns. The output of the OPC step 1054 is a mask design 1056. Alternatively, when OPC step 1054 includes fracturing or other MDP operations, the output of OPC step 1054 may be a shot list 1060.

Mask process correction (MPC) 1057 may optionally be performed on the mask design 1056. MPC modifies the pattern to be written to the reticle so as to compensate for non-linear effects associated with mask exposure and production, such as effects associated with mask patterns smaller than about 100 nm in masks to be used with conventional optical lithography. MPC may also be used to compensate for non-linear effects affecting EUV masks. If MPC 1057 is performed, its output becomes the input for mask data preparation (MDP) step 1058.

In a step 1058, a mask data preparation (MDP) operation, which may include a fracturing operation, a shot placement operation, a dose assignment operation, or a shot sequence optimization, may take place. MDP may use as input the mask design 1056 or the results of MPC 1057. In some embodiments, MPC may be performed as part of a fracturing or other MDP operation. Other corrections may also be performed as part of fracturing or other MDP operation, the possible corrections including: forward scattering, resist diffusion, Coulomb effect, etching, backward scattering, fogging, loading, resist charging, and EUV midrange scattering. The result of MDP step 1058 is a shot list 1060. Combining OPC and any or all of the various operations of mask data preparation in one step is contemplated in this disclosure. Mask data preparation may also comprise inputting patterns to be formed on a reticle with the patterns being slightly different, selecting a set of characters to be used to form the number of patterns, the set of characters fitting on a stencil mask, the set of characters possibly including both complex and VSB characters, and the set of characters based on varying character dose or varying character position or varying the beam blur radius or applying partial exposure of a character within the set of characters or dragging a character to reduce the shot count or total write time. A set of slightly different patterns on the reticle may be designed to produce substantially the same pattern on a substrate. Also, the set of characters may be selected from a predetermined set of characters. In one embodiment of this disclosure, a set of characters to be available on a stencil 1084, where the characters may be selected quickly during the mask writing step 1062, may be prepared for a specific mask design. In that embodiment, once the mask data preparation step 1058 is completed, a stencil is prepared in a step 1084. In another embodiment of this disclosure, a stencil is prepared in the step 1084 prior to or simultaneous with the MDP step 1058 and may be independent of the particular mask design. In this embodiment, the characters available in the library of characters 1080 and the stencil layout are designed in step 1082 to output generically for many potential mask designs 1056 to incorporate patterns that are likely to be output by a particular OPC program 1054 or a particular MDP program 1058 or particular types of designs that characterize types of physical designs, such as memories, flash memories, system on chip designs, or particular process technology, or a particular cell library used to create the physical design, or any other common characteristics that may form different sets of slightly different patterns in mask design 1056. The stencil can include a set of characters, such as a limited number of characters that were determined in the step 1058. In another embodiment of this disclosure, only VSB shots are used without complex characters. In yet another embodiment of this disclosure, MDP step 1058 may generate multi-beam shots.

The shot list 1060 is used as input to double simulation 1070, as set forth in FIG. 9 and described above, to create a calculated wafer aerial image 1072. Additionally, a set of complex characters 1080 may be input to double simulation 1070 if the shot list 1060 includes complex character shots. Using calculated wafer aerial image 1072, target wafer image 1052, and shot list 1060, wafer image optimization is done in step 1078. In this optimization step, shots in shot list 1060 are modified to improve the wafer aerial image. This improvement may comprise reducing the difference between the calculated wafer aerial image 1072 and the target wafer image 1052, and/or may also comprise improving manufacturability of the wafer by improving, for example, any of process variation (PV) band, depth of field, MEEF, CD variation, edge placement error (EPE), and area variation. Wafer image optimization 1078 may also comprise doing double simulation, for example, to determine if the modified shots will produce a wafer aerial image that is sufficiently close to the target wafer image 1052. In some embodiments, wafer process simulation 1074 may be performed on calculated wafer aerial image 1072 as set forth in FIG. 9 to create a simulated wafer pattern 1076. In embodiments which include wafer process simulation 1074, the simulated wafer pattern 1076, target wafer image 1052 and shot list 1060 are inputs to wafer image optimization step 1078, in which shots are modified to improve the simulated wafer pattern. This improvement may comprise reducing a difference between the simulated wafer pattern 1076 and the target wafer image 1052. Wafer image optimization 1078 produces an optimized shot list 1090. In some embodiments MDP 1058 may include double simulation 1070 and wafer image optimization 1078. In other embodiments, MDP 1058 may include double simulation 1070, wafer process simulation 1074 and wafer image optimization 1078.

The optimized shot list 1090 is used to generate a reticle in mask writing step 1062, which uses a charged particle beam writer such as an electron beam writer system. In some embodiments mask writing step 1062 may use stencil 1084 containing both VSB apertures and a plurality of complex characters. In other embodiments mask writing step 1062 may use a stencil comprising only VSB apertures. In yet other embodiments mask writing step 1062 may use a multi-beam exposure system, which may use a plurality of apertures to create shaped beamlets, or which may use unshaped beamlets. The electron beam writer system projects a beam of electrons through the stencil onto a surface to form patterns on a surface such as a reticle, which is then processed to become a photomask 1064. The completed photomask 1064 may then be used in an optical lithography machine, which is shown in a step 1066. Finally, in a step 1068, a wafer image on a substrate such as a silicon wafer is produced. As has been previously described, library of characters 1080 may be provided to the OPC step 1054, the MDP step 1058, and/or the double simulation step 1070. Library of characters 1080 also provides characters to a character and stencil design step 1082. The character and stencil design step 1082 provides input to the stencil step 1084 and to the library of characters 1080.

Figure 11:
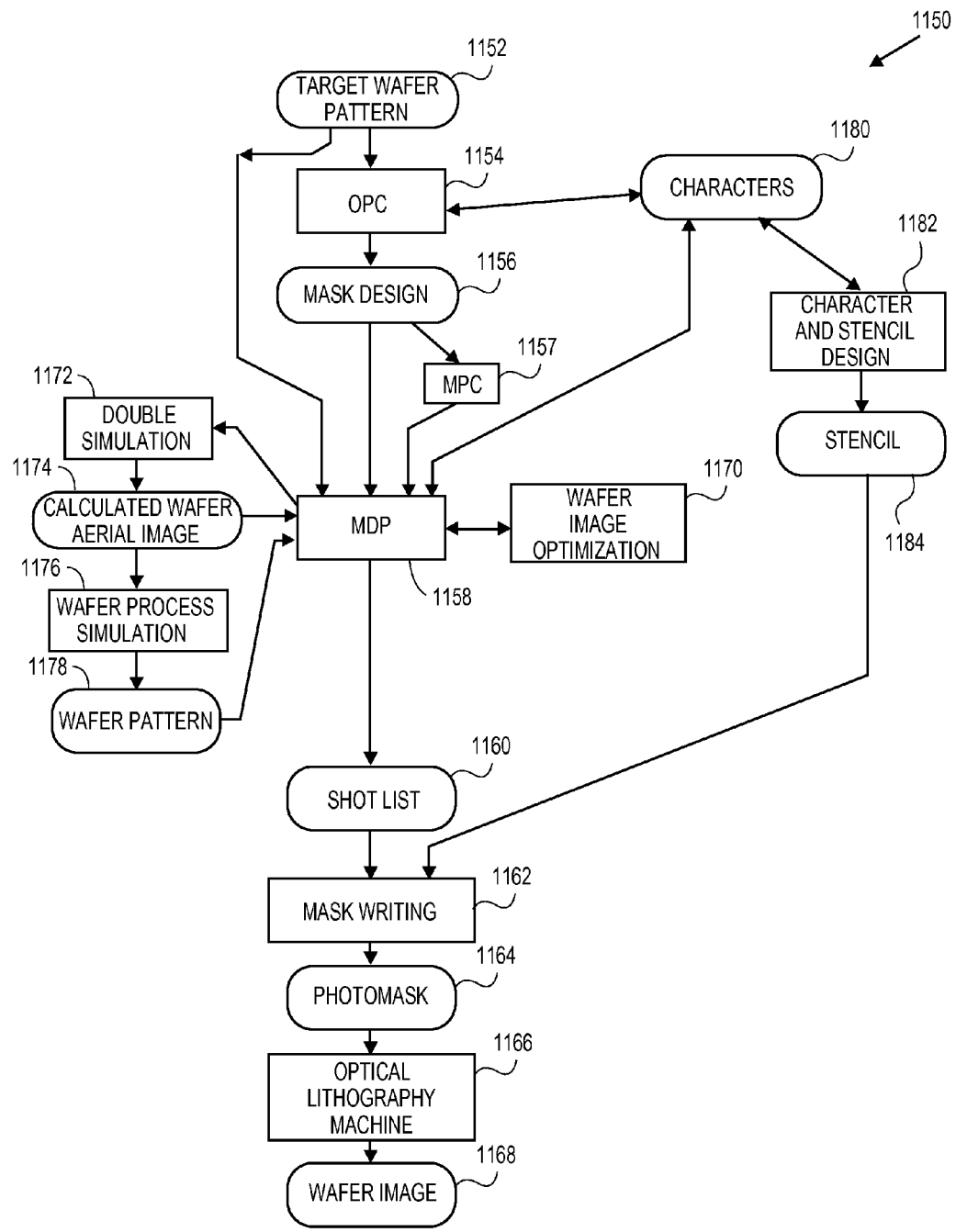
FIG. 11 illustrates another embodiment of a conceptual flow diagram for preparing a surface in fabricating a substrate such as an integrated circuit on a silicon wafer.

FIG. 11 is a conceptual flow diagram 1150 of how to prepare a reticle for use in fabricating a surface such as an integrated circuit on a silicon wafer, according to another embodiment of the present disclosure. The input to the flow is a target wafer pattern 1152, obtained from a CAD pattern such as a physical design of an integrated circuit. Next, in a step 1154, optical proximity correction (OPC) is determined.

In an embodiment of this disclosure, step 1154 can include taking as input a library of pre-designed characters 1180 including complex characters that are to be available on a stencil 1184 in a mask writing step 1162. Stencil 1184 may be pre-designed for use by multiple designs, and the use of characters 1180 later optimized by OPC 1154 and/or MDP 1158. In an embodiment of this disclosure, an OPC step 1154 may also include simultaneous optimization of shot count or write times, and may also include a fracturing operation, a shot placement operation, a dose assignment operation, or may also include a shot sequence optimization operation, or other mask data preparation operations, with some or all of these operations being simultaneous or combined in a single step. The OPC step 1154 may create partially or completely curvilinear patterns. In an embodiment of this disclosure, the OPC step 1154 may comprise ILT which creates ideal curvilinear ILT patterns. In another embodiment of this disclosure, the OPC step 1154 may comprise ILT which creates rectilinearized ILT patterns. The output of the OPC step 1154 is a mask design 1156.

Mask process correction (MPC) 1157 may optionally be performed on the mask design 1156. MPC modifies the pattern to be written to the reticle so as to compensate for non-linear effects associated with mask exposure and production, such as effects associated with mask patterns smaller than about 100 nm in masks to be used with conventional optical lithography. MPC may also be used to compensate for non-linear effects affecting EUV masks. If MPC 1157 is performed, its output becomes the input for mask data preparation (MDP) step 1158.

In a step 1158, a mask data preparation (MDP) operation, which may include a fracturing operation, a shot placement operation, a dose assignment operation, a shot sequence optimization, or wafer image optimization. MDP may use as input the mask design 1156 or the results of MPC 1157. MDP step 1158 may also use as input the target wafer pattern 1152. In some embodiments, MPC may be performed as part of a fracturing or other MDP operation. Other corrections may also be performed as part of fracturing or other MDP operation, the possible corrections including: forward scattering, resist diffusion, Coulomb effect, etching, backward scattering, fogging, loading, resist charging, and EUV midrange scattering. The result of MDP step 1158 is a shot list 1160. Combining OPC and any or all of the various operations of mask data preparation in one step is contemplated in this disclosure. Mask data preparation may also comprise inputting patterns to be formed on a reticle with the patterns being slightly different, selecting a set of characters to be used to form the number of patterns, the set of characters fitting on a stencil mask, the set of characters possibly including both complex and VSB characters, and the set of characters based on varying character dose or varying character position or varying the beam blur radius or applying partial exposure of a character within the set of characters or dragging a character to reduce the shot count or total write time. A set of slightly different patterns on the reticle may be designed to produce substantially the same pattern on a substrate. Also, the set of characters may be selected from a predetermined set of characters. In one embodiment of this disclosure, a set of characters to be available on a stencil 1184, where the characters may be selected quickly during the mask writing step 1162, may be prepared for a specific mask design. In that embodiment, once the mask data preparation step 1158 is completed, a stencil is prepared in a step 1184. In another embodiment of this disclosure, a stencil is prepared in the step 1184 prior to or simultaneous with the MDP step 1158 and may be independent of the particular mask design. In this embodiment, the characters available in the step 1180 and the stencil layout are designed in step 1182 to output generically for many potential mask designs 1156 to incorporate patterns that are likely to be output by a particular OPC program 1154 or a particular MDP program 1158 or particular types of designs that characterizes types of physical designs, such as memories, flash memories, system on chip designs, or particular process technology, or a particular cell library used to create the physical design, or any other common characteristics that may form different sets of slightly different patterns in mask design 1156. The stencil 1184 can include a set of characters, such as a limited number of characters that were determined in the step 1158. In another embodiment of this disclosure, only VSB shots are used without complex characters. In yet another embodiment of this disclosure, MDP step 1158 may generate multi-beam shots.

MDP 1158 may generate a set of shots 1160 which will form a reticle pattern that will produce a wafer aerial image or wafer pattern on a substrate, where the wafer aerial image or wafer pattern is within a pre-determined tolerance of target wafer pattern 1152. In some embodiments, MDP 1158 includes performing wafer image optimization 1170 on an initially-generated set of shots, then modifying the shots to improve the wafer aerial image or wafer pattern. This improvement may comprise reducing the difference between the wafer aerial image or wafer pattern and the target wafer pattern 1152, and/or may also comprise improving manufacturability of the wafer by improving, for example, any of process variation (PV) band, depth of field, MEEF, CD variation, edge placement error (EPE), and area variation. In some embodiments, MDP 1158 includes performing double-simulation 1172 to calculate a calculated wafer aerial image 1174. In other embodiments, MDP 1158 includes performing wafer process simulation 1176 to calculate a wafer pattern 1178 from the calculated wafer aerial image 1174, in which case wafer image optimization 1170 may modify an initially-generated set of shots to improve the wafer pattern.

Shot list 1160 is used to generate a reticle in mask writing step 1162, which uses a charged particle beam writer such as an electron beam writer system. In some embodiments mask writing step 1162 may use stencil 1184 containing both VSB apertures and a plurality of complex characters. In other embodiments mask writing step 1162 may use a stencil comprising only VSB apertures. In yet other embodiments mask writing step 1162 may use a multi-beam exposure system, which may use a plurality of apertures to create shaped beamlets, or which may use a plurality of unshaped beamlets. The electron beam writer system projects a beam of electrons through the stencil onto a surface to form patterns on a surface such as a reticle, which is then processed to become a photomask 1164. The completed photomask 1164 may then be used in an optical lithography machine, which is shown in a step 1166. Finally, in a step 1168, a substrate such as a silicon wafer is produced. As has been previously described, library of characters 1180 may be provided to the OPC step 1154 and/or the MDP step 1158. Library of characters 1180 may also be provided to double simulation step 1170 (this provision not illustrated). Library of characters 1180 also provides characters to a character and stencil design step 1182. The character and stencil design step 1182 provides input to the stencil step 1184 and to the library of characters 1180.

The fracturing, mask data preparation, and other flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or the difference between a calculated wafer image and a target wafer image, or MEEF, or CD variation, or some other parameter. In yet another embodiment, the wafer optimization may be performed in a correct-by-construction method, so that no iteration or further simulation are required.

Figure 12:
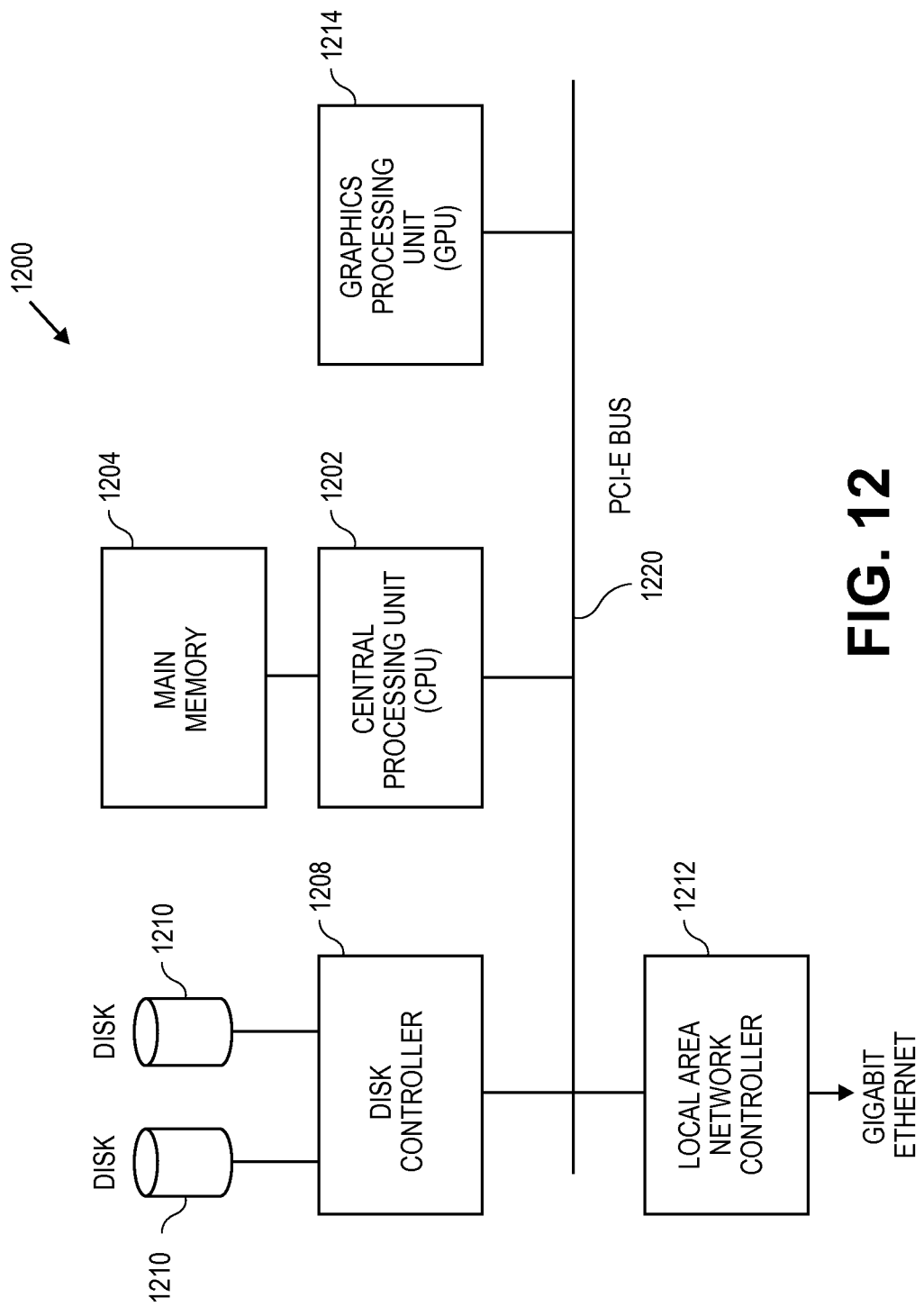
FIG. 12 illustrates an exemplary computing hardware device used in embodiments of the methods.

FIG. 12 illustrates an example of a computing hardware device 1200 that may be used to perform the calculations described in this disclosure. Computing hardware device 1200 comprises a central processing unit (CPU) 1202, with attached main memory 1204. The CPU may comprise, for example, eight processing cores, thereby enhancing performance of any parts of the computer software that are multi-threaded. The size of main memory 1204 may be, for example, 64 G-bytes. The CPU 1202 is connected to a Peripheral Component Interconnect Express (PCIe) bus 1220. A graphics processing unit (GPU) 1214 is also connected to the PCIe bus. In computing hardware device 1200 the GPU 1214 may or may not be connected to a graphics output device such as a video monitor. If not connected to a graphics output device, GPU 1214 may be used purely as a high-speed parallel computation engine. The computing software may obtain significantly-higher performance by using GPU 1214 for a portion of the calculations, compared to using CPU 1202 for all the calculations. The CPU 1202 communicates with the GPU 1214 via PCIe bus 1220. In other embodiments (not illustrated) GPU 1214 may be integrated with CPU 1202, rather than being connected to PCIe bus 1220. Disk controller 1208 may also be attached to the PCIe bus, with, for example, two disks 1210 connected to disk controller 1208. Finally, a local area network (LAN) controller 1212 may also be attached to the PCIe bus, and provides Gigabit Ethernet (GbE) connectivity to other computers. In some embodiments, the computer software and/or the design data are stored on disks 1210. In other embodiments, either the computer programs or the design data or both the computer programs and the design data may be accessed from other computers or file serving hardware via the GbE Ethernet.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, forming a pattern on a reticle, and manufacturing an integrated circuit may be practiced by those of ordinary skill in the art, without departing from the scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation (MDP) for charged particle beam lithography, the method comprising:
   determining a plurality of charged particle beam shots that will produce a pattern on a reticle, wherein the reticle is to be used to form an aerial image on a resist-coated substrate using an optical lithographic process;
   calculating a simulated reticle pattern that will be produced on the reticle from the plurality of charged particle beam shots;
   calculating a calculated aerial image which will be formed on the resist-coated substrate using the optical lithographic process with the simulated reticle pattern; and
   modifying a shot in the plurality of charged particle beam shots to improve the calculated aerial image,
   wherein the determining is performed using one or more computing hardware processors.

2. The method of claim 1 wherein the modifying improves a manufacturability characteristic of the calculated aerial image, wherein the manufacturability characteristic is selected from the group consisting of process variation (PV) band, depth of field, mask edge error factor (MEEF), critical dimension (CD) variation, edge placement error (EPE), and area variation.

3. The method of claim 1 wherein a shot in the plurality of charged particle beam shots comprises a multi-beam shot.

4. The method of claim 1 wherein the calculating of the simulated reticle pattern comprises charged particle beam simulation.

5. The method of claim 4 wherein the charged particle beam simulation includes at least one of a group consisting of forward scattering, backward scattering, resist diffusion, Coulomb effect, fogging, loading and resist charging.

6. The method of claim 1 wherein the calculating of the simulated reticle pattern comprises simulating at least one of the group consisting of resist bake, resist development and etch.

7. The method of claim 1 wherein the calculating of the calculated aerial image comprises lithography simulation.

8. The method of claim 1, further comprising calculating a substrate image from the calculated aerial image, wherein calculating the substrate image comprises simulating at least one of a group consisting of resist bake, resist development, and etch.

9. A method for forming a pattern on a reticle using charged particle beam lithography, the method comprising:
   determining a plurality of charged particle beam shots that will form the pattern on the reticle, wherein the reticle is to be used to form an aerial image on a resist-coated substrate using an optical lithographic process;
   calculating a simulated reticle pattern that will be produced on the reticle from the plurality of charged particle beam shots;
   calculating a calculated aerial image which will be formed on the resist-coated substrate using the optical lithographic process with the simulated reticle pattern;
   modifying a shot in the plurality of charged particle beam shots to improve the calculated aerial image; and
   forming the pattern on the reticle with the plurality of charged particle beam shots, including the modified shot.

10. The method of claim 9 wherein the modifying improves a manufacturability characteristic of the calculated substrate image, wherein the manufacturability characteristic is selected from the group consisting of process variation (PV) band, depth of field, mask edge error factor (MEEF), critical dimension (CD) variation, edge placement error (EPE), and area variation.

11. The method of claim 9 wherein a shot in the plurality of charged particle beam shots comprises a multi-beam shot.

12. The method of claim 9 wherein the calculating of the simulated reticle pattern comprises charged particle beam simulation.

13. The method of claim 9 wherein the calculating of the calculated aerial image comprises lithography simulation.

14. The method of claim 9, further comprising calculating a substrate image from the calculated aerial image, wherein calculating the substrate image comprises simulating at least one of a group consisting of resist bake, resist development, and etch.

15. A method for manufacturing an integrated circuit comprising a resist-coated substrate, the method comprising:
   determining a plurality of charged particle beam shots that will produce a pattern on a reticle, wherein the reticle is to be used to form an aerial image on the resist-coated substrate using an optical lithographic process;
   calculating a simulated reticle pattern that will be produced on the reticle from the plurality of charged particle beam shots;
   calculating a calculated aerial image which will be formed on the resist-coated substrate using the optical lithographic process with the simulated reticle pattern;
   modifying a shot in the plurality of charged particle beam shots to improve the calculated aerial image; and
   forming the pattern on the reticle with the plurality of charged particle beam shots, including the modified shot.

16. The method of claim 15 wherein the modifying improves a manufacturability characteristic of the calculated substrate image, wherein the manufacturability characteristic is selected from the group consisting of process variation (PV) band, depth of field, mask edge error factor (MEEF), critical dimension (CD) variation, edge placement error (EPE), and area variation.

17. The method of claim 15 wherein a shot in the plurality of charged particle beam shots comprises a multi-beam shot.

18. The method of claim 15 wherein the calculating of the simulated reticle pattern comprises charged particle beam simulation.

19. The method of claim 18 wherein the charged particle beam simulation includes at least one of a group consisting of forward scattering, backward scattering, resist diffusion, Coulomb effect, fogging, loading and resist charging.

20. The method of claim 15 wherein the calculating of the calculated aerial image comprises lithography simulation.

21. The method of claim 15, further comprising calculating a substrate image from the calculated aerial image, wherein calculating the substrate image comprises simulating at least one of a group consisting of resist bake, resist development, and etch.

22. A system for fracturing or mask data preparation (MDP) for charged particle beam lithography, the system comprising:
   a means for determining a plurality of charged particle beam shots that produce a pattern on a reticle, wherein the reticle is to be used to form an aerial image on a resist-coated substrate using an optical lithographic process;

a means for calculating a simulated reticle pattern that will be produced on the reticle from the plurality of charged particle beam shots;

a means for calculating a calculated aerial image which will be formed on resist-coated substrate using the optical lithographic process with the simulated reticle pattern; and a means for modifying a shot in the plurality of charged particle beam shots to improve the calculated aerial image.

23. The system of claim 22 wherein the means for modifying improves a manufacturability characteristic of the calculated substrate image, wherein the manufacturability characteristic is selected from the group consisting of process variation (PV) band, depth of field, mask edge error factor (MEEF), critical dimension (CD) variation, edge placement error (EPE), and area variation.

24. The system of claim 22 wherein the means for calculating the simulated reticle pattern performs charged particle beam simulation.

25. The system of claim 22 wherein the means for calculating the calculated aerial image performs lithography simulation.

26. The system of claim 22, further comprising a means for calculating the substrate image from the calculated aerial image, wherein the device configured to calculate the substrate image simulates at least one of a group consisting of resist bake, resist development, and etch.

* * * * *